US009966549B2

(12) United States Patent
Lee et al.

(10) Patent No.: US 9,966,549 B2
(45) Date of Patent: May 8, 2018

(54) NANOSTRUCTURED CARBON ELECTRODE, METHODS OF FABRICATING AND APPLICATIONS OF THE SAME

(71) Applicant: NORTHWESTERN UNIVERSITY, Evanston, IL (US)

(72) Inventors: Byunghong Lee, Evanston, IL (US); Donald B. Buchholz, Woodridge, IL (US); Robert P. H. Chang, Glenview, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days. days.

(21) Appl. No.: 15/362,227

(22) Filed: Nov. 28, 2016

(65) Prior Publication Data
US 2017/0077516 A1    Mar. 16, 2017

Related U.S. Application Data

(63) Continuation-in-part of application No. 13/776,034, filed on Feb. 25, 2013, now abandoned.
(Continued)

(51) Int. Cl.
| | |
|---|---|
| *H01L 51/00* | (2006.01) |
| *H01L 51/44* | (2006.01) |
| *H01M 4/133* | (2010.01) |
| *H01M 4/587* | (2010.01) |
| *H01M 4/96* | (2006.01) |

(Continued)

(52) U.S. Cl.
CPC ......... *H01L 51/442* (2013.01); *H01G 9/2022* (2013.01); *H01G 11/36* (2013.01); *H01G 11/46* (2013.01); *H01G 11/50* (2013.01); *H01G 11/86* (2013.01); *H01L 31/022475* (2013.01); *H01L 31/1884* (2013.01); *H01M 4/133* (2013.01); *H01M 4/587* (2013.01); *H01M 4/96* (2013.01); *H01G 9/2031* (2013.01); *H01G 9/2059* (2013.01); *H01G 11/26* (2013.01); *H01L 2031/0344* (2013.01); *H01M 4/0471* (2013.01); *H01M 4/1393* (2013.01); *H01M 10/0525* (2013.01); *H01M 12/06* (2013.01);
(Continued)

(58) Field of Classification Search
None
See application file for complete search history.

(56) References Cited

U.S. PATENT DOCUMENTS

2011/0033746 A1* 2/2011 Liu ...................... H01M 4/366
429/209

OTHER PUBLICATIONS

Journal of Materials Research, vol. 10, No. 8, Aug. 1995 and vol. 12, No. 6, Jun. 1997.
(Continued)

*Primary Examiner* — Barbara L Gilliam
*Assistant Examiner* — Wyatt P McConnell
(74) *Attorney, Agent, or Firm* — Locke Lord LLP; Tim Tingkang Xia, Esq.

(57) ABSTRACT

Nanostructured carbon electrode usable for electrochemical devices and methods of fabricating the same. The method of fabricating a nanostructured carbon electrode includes providing a carbon material of polyaromatic hydrocarbon (PAH), mixing the carbon material of PAH with a surfactant in a solution to form a suspension thereof; depositing the suspension onto a substrate to form a layered structure; and sintering the layered structure at a temperature for a period of time to form a nanostructured carbon electrode having a film of PAH.

9 Claims, 11 Drawing Sheets

Related U.S. Application Data

(60) Provisional application No. 61/602,311, filed on Feb. 23, 2012.

(51) Int. Cl.

| | | |
|---|---|---|
| *H01L 31/0224* | (2006.01) | |
| *H01L 31/18* | (2006.01) | |
| *H01G 11/36* | (2013.01) | |
| *H01G 11/46* | (2013.01) | |
| *H01G 11/86* | (2013.01) | |
| *H01G 9/20* | (2006.01) | |
| *H01G 11/50* | (2013.01) | |
| H01M 10/0525 | (2010.01) | |
| H01M 4/1393 | (2010.01) | |
| H01M 4/04 | (2006.01) | |
| H01G 11/26 | (2013.01) | |
| H01M 4/02 | (2006.01) | |
| H01L 31/0256 | (2006.01) | |
| H01M 12/06 | (2006.01) | |

(52) U.S. Cl.
CPC ...... *H01M 2004/021* (2013.01); *Y02E 10/542* (2013.01); *Y02E 60/122* (2013.01); *Y02E 60/13* (2013.01)

(56) References Cited

OTHER PUBLICATIONS

Stankovich, S.; Dikin, D. A.; Piner, R. D.; Kohlhaas, K. A.; Kleinhammes, A.; Jia, Y.; Wu, Y.; Nguyen, S. T.; Ruoff, R. S., Synthesis of graphene-based nanosheets via chemical reduction of exfoliated graphite oxide. Carbon 2007, 45 (7), 1558-1565.

Shchukarev, A. V.; Korolkov, D. V., XPS Study of group IA carbonates. Central European Journal of Chemistry 2004, 2 (2), 347-362.

Barr, T. L.; Seal, S., Nature of the use of adventitious carbon as a binding energy standard. Journal of Vacuum Science & Technology A 1995, 13 (3), 1239-1246.

Hantsche, H., High resolution XPS of organic polymers, the scienta ESCA300 database. By G. Beamson and D. Briggs, Wiley, Chichester, Advanced Materials 1993, 5 (10), 778-778.

\* cited by examiner

US 9,966,549 B2

NANOSTRUCTURED CARBON ELECTRODE, METHODS OF FABRICATING AND APPLICATIONS OF THE SAME

CROSS-REFERENCE TO RELATED PATENT APPLICATIONS

This application is a continuation-in-part application of U.S. patent application Ser. No. 13/776,034, filed Feb. 25, 2013, entitled "NANOSTRUCTURED CARBON ELECTRODE, METHODS OF FABRICATING AND APPLICATIONS OF THE SAME", by Byunghong Lee, Donald B. Buchholz, and Robert P. H. Chang, which itself claims priority to and the benefit of, pursuant to 35 U.S.C. § 119(e), U.S. provisional patent application Ser. No. 61/602,311, filed Feb. 23, 2012, entitled "NANOSTRUCTURE CARBON ELECTRODE, METHODS OF FABRICATION OF AND APPLICATIONS OF THE SAME", by Byunghong Lee, Donald B. Buchholz, and Robert P. H. Chang, which are incorporated herein in their entireties by reference.

STATEMENT AS TO RIGHTS UNDER FEDERALLY-SPONSORED RESEARCH

This invention was made with government support under DMR0843962 awarded by the National Science Foundation. The government has certain rights in the invention.

Some references, which may include patents, patent applications and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [3] represents the 3rd reference cited in the reference list, namely, Lee, B.; Hwang, D.-K.; Guo, P.; Ho, S.-T.; Buchholtz, D. B.; Wang, C.-Y.; Chang, R. P. H., Materials, Interfaces, and Photon Confinement in Dye-Sensitized Solar Cells. *The Journal of Physical Chemistry B* 2010, 114 (45), 14582-14591.

FIELD OF THE INVENTION

The invention generally relates to materials for composite and electronics applications, and more specifically to a nanostructured carbon electrode, methods of fabricating the same and applications of the same such as use in connection with electrochemical devices, including solar cells, batteries, capacitors, fuel cells and other related systems.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present invention.

Low cost, light-weight, safe, and durable energy storage devices and systems are in high demand as the global society is making a quick transition into clean energy and energy saving modes of living. While there are many options of generating clean energy such as solar, wind, and geothermal, there is also a big need for energy storage systems for transportation and local utility usage. This is part of the larger equation of how to reduce loss, such as long distance transmission of electricity, and conserve the use of energy.

To date, most of the energy storage systems are based on electro-chemical (EC) processes which stores and converts energy between electrical and chemical forms. For these systems to function efficiently and safely in a durable manner, decades of devoted research and development have been carried out. A survey of the literature has shown that carbon based electrode has been most studied due to its stability, durability, and chemically easy to work with. Above all, carbon is abundant, light and inexpensive.

Carbon comes in many allotropic forms, such as graphite, diamond, fullerenes, and carbon nanotubes and ropes, etc. Researchers have studied and used various combinations of these carbonaceous materials for the design and operation of electrodes for chemical devices. Carbonaceous materials such as graphite [14, 15] carbon black, [16] activated carbon [17], hard carbon sphere [18], carbon nanotube [19], fullerene and graphene [20], have been used as the catalytic materials. These carbonaceous materials show good electrochemical activity, and among them, carbon black holds the best performance [21]. However, in order to achieve comparable electrochemical performance as platinum, a thick (about 15 μm) carbon black layer is required as shown recently by Murakami et al. [21]. Cells fabricated with carbon black resulted in about 25% less energy conversion efficiency as compared to the platinized CE.

To improve this situation, it is necessary to further increase the surface to volume ratio of the carbon nano species as well as the edge surface area to basal surface area ratio of the carbon nano material [22]. The challenge is how and has not been answered satisfactorily yet.

Therefore, a heretofore unaddressed need exists in the art to address the aforementioned deficiencies and inadequacies.

SUMMARY OF THE INVENTION

In one aspect, the invention provides a desirable alternative is to synthesize very small polyaromatic hydrocarbon (PAH) clusters with as many as possible the number surface bonds available for chemical reaction. These large-effective-surface-area polyaromatic hydrocarbon (LPAH) layers increase charge specie diffusion and catalytic reactions. The invention discloses a novel and yet simple process of fabricating a nanostructure carbon electrode that is superior to all the prior teachings in the literature. Specifically, the invention teaches how a homogeneous, mono-dispersed nanostructured carbon thin film is fabricated as part of an all-carbon electrode. In other words, the thin film is devoid of oxygen atoms. By using a hydrogen (or hydrogen containing) gas electrical arc, large quantities of the LPAH are produced. The operation of the hydrogen gas electrical arc process is devoid of oxygen, and at the same, the active hydrogen guarantees the absence of any atomic oxygen in the PAH soot material produced. The produced material is then dispersed in a block copolymer suspension to form a homogenous thin film which becomes part of a carbon electrode. The formed thin film of the LPAH has a very high surface to volume ratio, thus has high efficiency in chemical reactivity. In addition, with the high density of nanopores and channels, it also provides high efficient charge (ions, electrons) transport through the layer. A specific example is given for the case of dye sensitized solar, which demonstrates that the new, all-carbon electrode is more efficient than the conventional platinum-based electrode.

In one aspect, the invention relates to a method for fabricating an LPAH electrode. In one embodiment, the method includes the steps of providing a carbon material of LPAH; mixing the carbon material of LPAH with a surfactant in a solution to form a suspension thereof; depositing the suspension onto a substrate; and sintering the deposited substrate at a temperature for a period of time to form an LPAH electrode comprising a film of LPAH on the substrate. The temperature is in a range of about 300-500° C.; and the period of time is in a range of about 10-30 minutes.

In one embodiment, the mixing step is performed by stirring for a predetermined time.

In one embodiment, the surfactant comprises an amphiphilictriblock copolymer. Preferably, the amphiphilictriblock copolymer comprises poly(ethylene oxide)-poly(propylene oxide)-poly(ethylene oxide) ($PEO_{20}$-$PPO_{70}$-$PEO_{20}$).

In one embodiment, the substrate comprises a patterned graphite substrate.

In one embodiment, the LPAH soot material is produced by a hydrogen containing gas electrical arc.

In one embodiment, the LPAH film comprises randomly oriented nano-sheets of hydrocarbon species homogenously and uniformly distributed throughout the LPAH film. Further, the LPAH film comprises a plurality of nanopores and channels.

In another aspect, the invention relates to a method for fabricating an LPAH electrode. In one embodiment, the method includes the steps of providing a patterned graphite film substrate; depositing a suspension of LPAH onto the patterned graphite substrate; sealing the edges of the patterned graphite substrate with the deposited suspension of LPAH with a polyimide film to form a layered structure; and curing the layered structure to form an LPAH electrode.

In one embodiment, the suspension of LPAH contains LPAH particles and a surfactant mixed in a surfactant in a solution, where the surfactant comprises an amphiphilictriblock copolymer. Preferably, the amphiphilictriblock copolymer comprises poly(ethylene oxide)-poly(propylene oxide)-poly(ethylene oxide) ($PEO_{20}$-$PPO_{70}$-$PEO_{20}$).

In one embodiment, the LPAH electrode comprises randomly oriented nano-sheets of hydrocarbon species homogenously and uniformly distributed throughout the LPAH film.

In one embodiment, the LPAH electrode comprises a plurality of nanopores and channels.

In yet another aspect of the invention, an article of manufacture has the LPAH electrode fabricated according to the above disclosed methods.

In a further aspect, the invention relates to an article of manufacture. In one embodiment, the article of manufacture includes a substrate with a first surface and a second, opposing surface; a dye coated $TiO_2$ nano-particle (NP) film formed on one of the first surface and the second surface of the substrate; a graphite film with a first surface and a second, opposing surface; an LPAH film formed on one of the first surface and the second surface of the graphite film; and a layer of electrolyte positioned between and in contact with the LPAH film and the dye coated $TiO_2$ NP film, wherein the substrate and the graphite film are separated apart from the dye coated $TiO_2$ NP film, the layer of electrolyte and the LPAH film.

In one embodiment, the substrate is a transparent conducting (TC) layer comprising an indium tin oxide (ITO) or fluorine doped tin oxide (FTO) glass layer, or a transparent flexible substrate coated with a TC layer.

In one embodiment, the LPAH film comprises LPAH particles and a surfactant. In one embodiment, the surfactant comprises an amphiphilictriblock copolymer, wherein the amphiphilictriblock copolymer comprises poly(ethylene oxide)-poly(propylene oxide)-poly(ethylene oxide) ($PEO_{20}$-$PPO_{70}$-$PEO_{20}$).

In one embodiment, the LPAH film comprises randomly oriented nano-sheets of hydrocarbon species homogenously and uniformly distributed throughout the LPAH film.

In one embodiment, the LPAH film comprises a plurality of nanopores and channels.

In one embodiment, the article of manufacture is a solar cell.

In yet a further aspect of the invention, an article of manufacture has an anode comprising a film of $TiO_2$ nanoparticles (NP) formed on a substrate; a cathode comparing a graphite film and a film of large-effective-surface-area polyaromatic hydrocarbon (LPAH) formed on the graphite film, wherein the anode and the cathode are positioned apart such that the $TiO_2$ NP film faces the LPAH film to define a space between the $TiO_2$ NP film faces the LPAH film; and an electrolyte filled in the space defined between the $TiO_2$ NP film faces the LPAH film.

In one embodiment, the substrate is a transparent conducting (TC) layer comprising an indium tin oxide (ITO) or fluorine doped tin oxide (FTO) glass layer, or a transparent flexible substrate coated with a TC layer.

In one embodiment, the LPAH film comprises LPAH particles and a surfactant, wherein the surfactant comprises an amphiphilictriblock copolymer. In one embodiment, the amphiphilictriblock copolymer comprises poly(ethylene oxide)-poly(propylene oxide)-poly(ethylene oxide) ($PEO_{20}$-$PPO_{70}$-$PEO_{20}$).

In one embodiment, the LPAH film comprises randomly oriented nano-sheets of hydrocarbon species homogenously and uniformly distributed throughout the LPAH film.

In one embodiment, the LPAH film comprises a plurality of nanopores and channels.

In one aspect of the invention, an article of manufacture includes nanosized hydrocarbon structures (NHS) formed of a large-effective-surface-area polyaromatic hydrocarbon (LPAH) material.

In one embodiment, the NHS is assembled from benzene rings with hydrogen atoms terminating any free bonds around the NHS.

In one embodiment, the NHS is formed either by standard chemical methods or by physical methods including an electrical arc, or sputtering from a graphite target.

In one embodiment, when the NHS is formed by using an electrical arc, a pair of graphite electrodes is used in a hydrogen containing atmosphere with gas pressure in the range of tens of torrs to several hundred torrs.

In another aspect of the invention, an article of manufacture has an electrode fabricated from an assembly of randomly oriented, homogeneously distributed nanosized hydrocarbon structures (NHS).

In one embodiment, the electrode is fabricated on a top of a conducting substrate.

In one embodiment, the electrode contains a film of large-effective-surface-area polyaromatic hydrocarbon (LPAH) with optimum interconnected nano pores and channels for charge transport through the LPAH film of the electrode.

In one embodiment, the NHS film is formed by intermixing NHS species with appropriate surfactants to produce an optimal physical and electrical desired for operation of the electrode for a device.

In one embodiment, the surfactant comprises an amphiphilictriblock copolymer.

In one embodiment, the amphiphilictriblock copolymer comprises poly(ethylene oxide)-poly(propylene oxide)-poly(ethylene oxide) ($PEO_{20}$-$PPO_{70}$-$PEO_{20}$).

The above disclosed article of manufacture is a solar cell, photosensor, battery, supercapacitor, or the likes.

These and other aspects of the invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
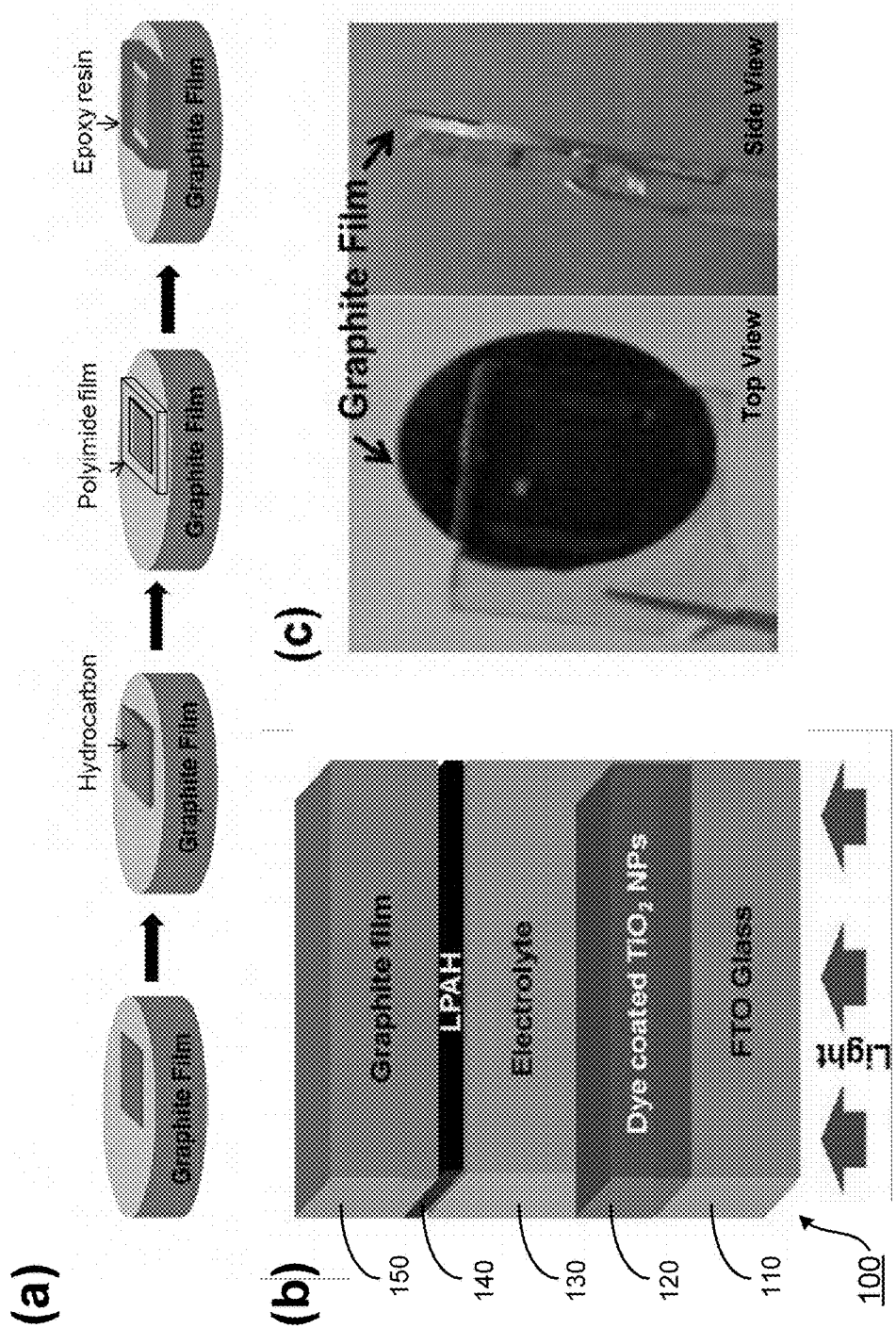
FIG. 1 shows (a) a schematic of fabrication procedures for all carbon CE, (b) a configuration of a solar cell having the all carbon CE, and (c) images of the fabricated solar cell, according to one embodiment of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "nanosized structure" and "nanostructure" are exchangeable and generally refer to an object having a size/dimension in the order of nanometers ($10^{-9}$ meters). In describing nanostructures, the sizes of the nanostructures refer to the number of dimensions on the nanoscale. For example, nanotextured surfaces have one dimension on the nanoscale, i.e., only the thickness (or the area) of the surface of an object is between 0.1 and 1000 nm. Sphere-like nanoparticles have three dimensions on the nanoscale, i.e., the particle is between 0.1 and 1000 nm in each spatial dimension. A list of nanostructures includes, but not limited to, nanoparticles, nanocomposites, quantum dots, nanofilms, nanoshells, nanofibers, nanorings, nanorods, nanowires, nanotubes, and so on.

As used herein, the term "LPAH" is abbreviated of large-effective-surface-area polyaromatic hydrocarbon, and the term "PAH" is abbreviated of polyaromatic hydrocarbon. In the disclosure, the terms "LPAH" and "PAH" are exchangeable and refer to the material of polyaromatic hydrocarbon having a large-effective-surface-area relative to its volume.

As used herein, if any, the term "atomic force microscopy" or its abbreviation "AFM" refers to a very high-resolution type of scanning probe microscopy, with demonstrated resolution on the order of fractions of a nanometer, more than 1000 times better than the optical diffraction limit.

As used herein, if any, the term "scanning electron microscope" or its abbreviation "SEM" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "electrochemical impedance spectroscopy" or its abbreviation "EIS" involves the study of the variation of the impedance of an electrochemical system with the frequency of a small-amplitude AC perturbation. In practice, the time-domain of the input and output signals are converted into a complex quantity that is a function of a frequency.

As used herein, if any, the term "Nyquist plot" refers to a polar plot of the frequency response function of a linear system. A Nyquist plots displays both amplitude and phase angle on a single plot, using frequency as a parameter in the plot.

As used herein, if any, the term "Bode plot" refers to a plot of the transfer function of a linear, time-invariant system versus frequency, plotted with a log-frequency axis, to show the system's frequency response. A Bode' plot uses frequency as the horizontal axis and uses two separate plots to display amplitude and phase of the frequency response.

The description will be made as to the embodiments of the invention in conjunction with the accompanying drawings. In accordance with the purposes of this disclosure, as embodied and broadly described herein, this disclosure, in one aspect, relates to a unique and novel approach to fabricate a nanostructured carbon electrode usable for electrochemical devices, including solar cells, batteries, capacitors, fuel cells and other related systems. The approach includes how a homogeneous, mono-dispersed nanostructured carbon thin film is fabricated as part of an all-carbon electrode. By using a hydrogen (or hydrogen containing) gas electrical arc, large quantities of large-effective-surface-area polyaromatic hydrocarbon (LPAH a.k.a., PAH) soot material are produced. In a typical operation of the electric arc, the chamber was first pumped down to a background pressure $2 \times 10^{-6}$ Torr (containing mostly air with some water vapor depending on the humidity) before filling the chamber with pure hydrogen to 50-500 Torr. This is about 7 to 9 orders of magnitude higher in pressure. Thus, one can ignore the concern of the presence of oxygen, that is, the operation of the hydrogen containing gas electrical arc process is devoid of oxygen. At the same, the active hydrogen guarantees the absence of any atomic oxygen in the PAH soot material produced.

An extensive research on the study of carbon materials produced in a hydrogen arc and the detailed findings were reported in the Journal of Materials Research, Vol. 10, No. 8, August 1995 and Vol. 12, No. 6, June 1997. In contrast to the prior work in the field, carbon materials such as fullerenes, nanotubes, and carbonaceous species were produced in an inert gas electric arc, using either helium or argon gases. Hydrogen is the lightest element with the highest thermal conductivity (0.15 W/m·K at 300 K). Therefore, it is a more efficient "quencher" for carbon vapor to condense. Using this active approach to chemically react between hydrogen and carbon species, the production of high quality bundles of carbon nanotubes with open tips on the cathode of the arc electrode was discovered. On the arc chamber walls we found large quantities of LPAH species. The production fullerenes, such as $C_{60}$ and $C_{70}$ was minimal. The mechanism for the production of LPAH was explained in detail using time of flight mass spectrometry in the first above article. In this study LPAH were found to be composed of various hydrocarbon species, without the presence of any atomic oxygen.

In certain embodiments, the PAH soot material is dispersed in a block copolymer suspension to form a homogenous thin film which becomes part of a carbon electrode. The thin film in this case would include numerous nano sheets of LPAH with many available atomic bonds around their perimeters for chemical reactions. In addition, with the high density of nanopores and channels, it also provides high efficient charge (ions, electrons) transport through the layer. A specific example is given for the case of dye sensitized solar. It demonstrates that the new, all-carbon electrode is more efficient than the conventional platinum-based electrode.

In one aspect, the invention relates to a method for fabricating a nanostructured carbon electrode. The method includes the following steps. At first, a carbon material of LPAH is synthesized (or produced). To generate large quantities of LPAH species, a hydrogen arc is used. A detailed description of the arc-system has been reported in an earlier publication [23]. For various embodiments of the invention, the arc is operated at the optimum condition of about 100 A and about 27 V with pure hydrogen pressure in a range of about 50-400 Torr. After about a one-hour of arc operation, a large amount (hundreds of grams) of the LPAH "soot" is generated and collected from the chamber walls. According to embodiments of the invention, the operation of the hydrogen containing gas electrical arc is substantially devoid of oxygen, and the generated LPAH soot material is thus substantially devoid of oxygen atoms. It should be appreciated that other systems can also be utilized to produce the carbon material of LPAH in accordance with the invention.

Next, the carbon material of LPAH is mixed with surfactants in a solution to form a suspension thereof. The LPAH produced by the hydrogen arc is highly hydrophobic and thus incline to aggregate. In order to make a thin film of LPAH for the nanostructured carbon, a surfactant needs to be identified for use in the dispersion process to homogenize the LPAH and making it suspendable in water and minimize aggregation. Generally, the dispersion via the adsorption of a polymer are considered to be stable as long as the individual particles do not aggregate or coagulate, and the block copolymers of high molecular weight polymers having two or more distinct regions of differing properties can be used as a vehicle for directing functional nanostructures onto surfaces. Even though different types of surfactants are required for different carbon material application, in majority of the studies, the sodium dodecyl sulfate (SDS) or Triton X ($C_{14}H_{22}O(C_2H_4O)_n$) has been used as the common surfactant for the dye sensitized solar cell (DSSC) counter electrode preparation. However, surprisingly little research has been reported on the optimization of the surfactant application. The reason for this is probably due to the fact that conversion efficiencies for various kinds of carbon based counter electrodes have not met with the breakthrough needed in spite of their unique physical and chemical properties.

According to the embodiments of the invention, an amphiphilictriblock copolymer, such as poly(ethylene oxide)-polypropylene oxide)-poly(ethylene oxide), often denoted as $PEO_{20}$-$PPO_{70}$-$PEO_{20}$ (commercialized under a generic name, P123) is most effective for individually suspending the LPAH. In one example, a suspension of the LPAH is prepared by mixing about 0.1 g of the LPAH "soot" carbon material and about 1000 µl of the P123 surfactant solution by stirring for about 20 hours.

The suspension is then deposited onto a substrate to form a layered structure. The substrate is a patterned graphite film substrate, or the likes. The layered structure is sintered at a temperature for a period of time to form a nanostructured carbon electrode comprising a film of LPAH. The surfactant does not exist in the film of PAH, and the film of PAH is devoid of oxygen atoms. The temperature is in a range of about 300-500° C.; and the period of time is in a range of about 10-30 minutes. For example, in one embodiment, the sintering process is performed at about 400° C. for about 20 minutes.

This invention, in one aspect, shows that LPAH thin films have very unique properties compared with other forms of carbon currently being used in electrochemical systems: For example, films resulted from LPAH suspended in SDS result in cracked surfaces; films resulted from LPAH suspended in Triton X surfactant show quite smooth surfaces with no cracks, but the films are not uniform throughout the surface. However, for the case of P123 a much more smooth and uniform LPAH film is fabricated as the result of much denser packing of the material. The LPAH film includes randomly oriented nano-sheets of hydrocarbon species homogenously and uniformly distributed throughout the LPAH film. Thus, the LPAH species provide very large surface to volume ratio within the film for active chemical reactions. In addition, the LPAH films have large amount of nanopores and channels for very efficient charge (ion) transport. These unique properties are the result of the combination of LPAH intermixed with P123 surfactant during thin film process and fabrication.

In alternative aspect of the invention, the method for fabricating an LPAH electrode includes the steps of providing a patterned graphite film substrate; depositing a suspension of LPAH onto the patterned graphite substrate; sealing the edges of the patterned graphite substrate with the deposited suspension of LPAH with a polyimide film to form a layered structure; and curing the layered structure to form an LPAH electrode.

As disclosed above, the suspension of LPAH contains LPAH particles and a surfactant mixed in a surfactant in a solution, where the surfactant comprises an amphiphilictriblock copolymer. Preferably, the amphiphilictriblock copolymer comprises poly(ethylene oxide)-poly(propylene oxide)-poly(ethylene oxide) ($PEO_{20}$-$PPO_{70}$-$PEO_{20}$).

Similarly, the LPAH electrode includes randomly oriented nano-sheets of hydrocarbon species homogenously and uniformly distributed throughout the LPAH film, and has a plurality of nanopores and channels for very efficient charge (ion) transport.

In yet another aspect, the invention includes an article of manufacture having the LPAH electrode fabricated according to the above disclosed methods. The article of manufacture includes, but not limited to, an electrochemical device, such as a solar cell, battery, capacitor, fuel cell, or other related system.

In one exemplary embodiment, as shown in FIG. 1(b), the article of manufacture is a dye sensitized solar cell 100 that includes a substrate 110, a dye coated $TiO_2$ nano-particle (NP) film 120 formed on the substrate 110, a graphite film 150, an LPAH film 140 formed on the graphite film 150, and a layer of electrolyte 130 positioned between and in contact with the LPAH film 140 and the dye coated $TiO_2$ NP film 120.

The substrate 110 is a transparent conducting (TC) layer, which can be an indium tin oxide (ITO) or fluorine doped tin oxide (FTO) glass layer, or a transparent flexible substrate coated with a TC layer.

The LPAH film 140 is formed from, for example, a suspension of LPAH in a surfactant solution, as disclosed above. The surfactant solution includes an amphiphilictri-block copolymer, preferably, $PEO_{20}$-$PPO_{70}$-$PEO_{20}$, also known as P123. Accordingly, the LPAH film contains randomly oriented nano-sheets of hydrocarbon species homogenously and uniformly distributed throughout the LPAH film, and has a plurality of nanopores and channels.

Alternatively, the article of manufacture has an anode comprising a film of $TiO_2$ nanoparticles (NP) formed on a substrate, a cathode comparing a graphite film and a film LPAH formed on the graphite film, where the anode and the cathode are positioned apart such that the $TiO_2$ NP film faces the LPAH film to define a space between the $TiO_2$ NP film faces the LPAH film, and an electrolyte filled in the space.

In one aspect of the invention, an article of manufacture includes nanosized hydrocarbon structures (NHS) formed of a LPAH material.

In one embodiment, the NHS is assembled from benzene rings with hydrogen atoms terminating any free bonds around the NHS.

In one embodiment, the NHS is formed either by standard chemical methods or by physical methods including an electrical arc, or sputtering from a graphite target. When the NHS is formed by using an electrical arc, a pair of graphite electrodes is used in a hydrogen containing atmosphere with gas pressure in the range of tens of torrs to several hundred torrs.

In another aspect of the invention, an article of manufacture has an electrode fabricated from an assembly of randomly oriented, homogeneously distributed NHS.

In one embodiment, the electrode is fabricated on a top of a conducting substrate.

In one embodiment, the electrode contains a film of LPAH with optimum interconnected nano pores and channels for charge transport through the LPAH film of the electrode.

In one embodiment, the NHS film is formed by intermixing NHS species with appropriate surfactants to produce an optimal physical and electrical desired for operation of the electrode for a device.

In one embodiment, the surfactant comprises an amphiphilictriblock copolymer.

In one embodiment, the amphiphilictriblock copolymer comprises $PEO_{20}$-$PPO_{70}$-$PEO_{20}$, or P123.

The above disclosed article of manufacture can be, but not limited to, an electrochemical device, such as a solar cell, battery, capacitor, fuel cell, or other related system.

All electro-chemical devices currently in use include a pair of electrodes with electrolytes in between for the transport of charges (ions and electron). It is well known that some of these electrolytes can be very corrosive to the electrodes, such as iodide/iodine used in dye sensitized solar cells. Therefore, along with other stringent requirements, only a limited choice of electrode materials is currently available. Most of them are carbon in one form or another.

Accordingly, the all carbon electrode with an LPAH thin film of the invention can find many applications in a wide spectrum of fields. Without intent to limit the scope of the invention, some of the applications are given as examples as follows.

EXAMPLE I: AN ALL CARBON COUNTER ELECTRODE BASED DYE SENSITIZED SOLAR CELL

Dye sensitized solar cells (DSSCs) have shown promise as an alternative to conventional thin film solar cells primarily for its cost advantage [1, 2]. A conventional DSSC can be modeled as a unipolar-junction cell where an n-type $TiO_2$ nano-particle (NP) film deposited on a transparent conducting substrate serving as the anode electrode of the cell. The nano-particles of the film are coated with a monolayer of dye molecules to absorb the solar photons. The photo-generated charge pair separation takes place at the interface of the $TiO_2$ NPs in contact with an electrolyte (through the dye molecule) which serves to transport the charges to the cathode (the counter electrode, CE) of the cell for the reduction of the redox species used as a mediator in regenerating the sensitizer after electron injection. The configuration of such a cell has been described many times in the literature [3, 4]. A suitable redox charge mediator should effectively perform the function of shuttling the generated positive charge away from the light absorbing sensitizer residing on the semiconductor surface to the CE, thus completing the electrical circuit. In a conventional DSSC, the electrolyte can either be a liquid (e.g., iodine mixed with imidazoliumidode, guanidiniumthiocyanate, 4-tert-butylpyridine in acetonitrile and valeronitrile) [5, 6] or a solid (e.g., PVDF-HFP based gel electrolyte, p-type semiconductor based on copper compounds, inorganic hole-transport materials) [7-11, 55]. The counter electrode usually includes a thin platinum nano-particle layer coated on the top of the fluorine doped tin oxide (FTO) glass substrate [12]. Because of the high catalytic effect of platinum, only a small concentration of the platinum nano-particles (<3 $\mu g/cm^2$) is needed to enhance the kinetics of the catalyst and provide a large surface area to sustain high current flow through the CE to the outside world [13]. While platinum, a precious metal, has been the preferred material for the counter electrode, there is incentive to develop DSSC counter electrodes using inexpensive and easy to apply materials, such as carbonaceous materials.

This example discloses the design and operation of a DSSC with an all carbon counter electrode and plastic electrolyte. For the construction of the counter electrode, the conventional thin platinum catalytic layer was replaced by a novel LPAH film, and the FTO substrate was replaced by a graphite film to further reduce the cell internal resistance and thus improving cell efficiency. As a result, the internal resistance of the cell was substantially reduced and the cell efficiency can reach near 9% using the masked frame measurement technique. In comparison with the conventional DSSC, the all carbon CE is more efficient, and potentially less expensive.

According to the invention, the LPAH layer synthesis technique includes producing the LPAH from a hydrogen arc along with the use of surfactant such as an amphiphilic triblock copolymer to improve the suspendability of the LPAH to form a homogenous catalytic layer. This layer is then attached to a graphite film to form the counter electrode for the dye sensitized solar cell. As disclosed below, the LPAH synthesis and characterization are reported first, followed by a discussion on the importance of using an appropriate surfactant for the LPAH dispersion. Electrical measurements are carried out to compare the catalytic effects of platinum, carbon black, and LPAH. Finally, three different types of DSSC structures, such as FTO-TiO$_2$/dye-plastic electrolyte-Pt/FTO, FTO-TiO$_2$/dye-plastic electrolyte-LPAH/FTO, and FTO-TiO$_2$/dye-plastic electrolyte-LPAH/Graphite film, are fabricated and comparison studies are made.

LPAH Synthesis and Characterization

To generate large quantities of LPAH species, a hydrogen arc was used, where the operation of the hydrogen containing gas electrical arc process is devoid of oxygen. A detailed description of the arc-system has been reported in an earlier publication [23_ENREF_22]. In the exemplary example, the arc was operated at the optimum condition of about 100 A and about 27 V with pure hydrogen pressure in the range about 50 Torr to about 400 Torr. After about a one-hour of the arc operation, a large amount (about one gram) of the LPAH "soot" was generated and collected from the chamber walls. The detailed morphologies of the LPAH were observed by the field emission scanning electron microscopy (FE-SEM, S4800, Hitachi) equipped with an energy-dispersive spectrometer (EDS). Structural characterization of the LPAH was done by X-ray diffraction (XRD, D/MAX-A, Rigaku) featuring Jade Analysis software. AFM imaging was also used to analyze the surface topography by using Dimension Icon Scanning Probe Microscope (Veeco, USA) in the tapping mode. Tapping mode high resolution imaging of samples was obtained by overcoming problems associated with friction, adhesion, electrostatic forces, and other difficulties that can plague conventional AFM scanning methods.

The surface area and pore size distribution of the synthesized LPAH were measured by nitrogen adsorption/desorption isotherms, using a Micromeritics ASAP 2020 system. The sample was degassed at about 398 K under vacuum overnight before analysis, to remove any adsorbed impurities. The surface area was measured using the Brunauer-Emmett-Teller (BET) model for relative pressures and the distribution of pore dimensions was calculated using the Barrett-Joyner-Halenda (BJH) model [24, 25].

The electocatalytic properties of the synthesized LPAH were measured by electrochemical impedance spectroscopy (EIS). In order to obtain the charge transfer resistance ($R_{ct}$), a conventional symmetric cell was fabricated [26]. The cell was built by sealing two identically prepared electrodes with a 60 μm Thermoplast hot-melt sealing sheet (Surlyn, from Solaronix, Switzerland) in between and sealed in a hot press. The spacer had an opening of about 0.188 cm$^2$ filled with a liquid electrolyte dissolving about 0.6 M of 1-butyl-3-methylimidazolium iodide (BMII), about 0.03 M of iodine, about 0.1 M of guanidiniumthiocyanate (GSCN) and about 0.5 M of 4-tert-butylpyridine (tBP) in acetonitrile and valeronitrile (about 85:15 v/v).

The operation of the hydrogen containing gas electrical arc process is substantially devoid of oxygen, and at the same, the active hydrogen guarantees the absence of any atomic oxygen in the LPAH soot material produced. To characterize the elemental composition (specially, oxygen) of the PAH film, which is described above, X-ray photoelectron spectroscopy (XPS) is used. The XPS is a surface-sensitive and quantitative spectroscopic technique that is able to analyze chemical bonds on surface within 10 nm in depth. Through the XPS, therefore, the oxygen can be detected from the chemical environment of carbon atom.

For sample preparation, a suspension of LPAH was deposited on a graphite film and sintered at 400° C. for 20 min in all-air atmosphere. As control samples, a pristine graphite film, and an air dried PAH film on graphite at room temperature were used. The test is performed by a multi-functional photoelectron spectrometer (Thermo Scientific ESCALAB250Xi) with Al Kα X-ray. The equipment works under a power of about 200 W and a beam spot diameter of 500 The analysis is done under vacuum condition with a pressure of 3×10$^{-1}$ mbar. The binding energies are calibrated using the C1s (electrons in the is subshell) peak with a reference of 284.8 eV. In the XPS spectra, the ordinate represents the electrical counter, and abscissa stands for binding energy (BE).

Figure 11:
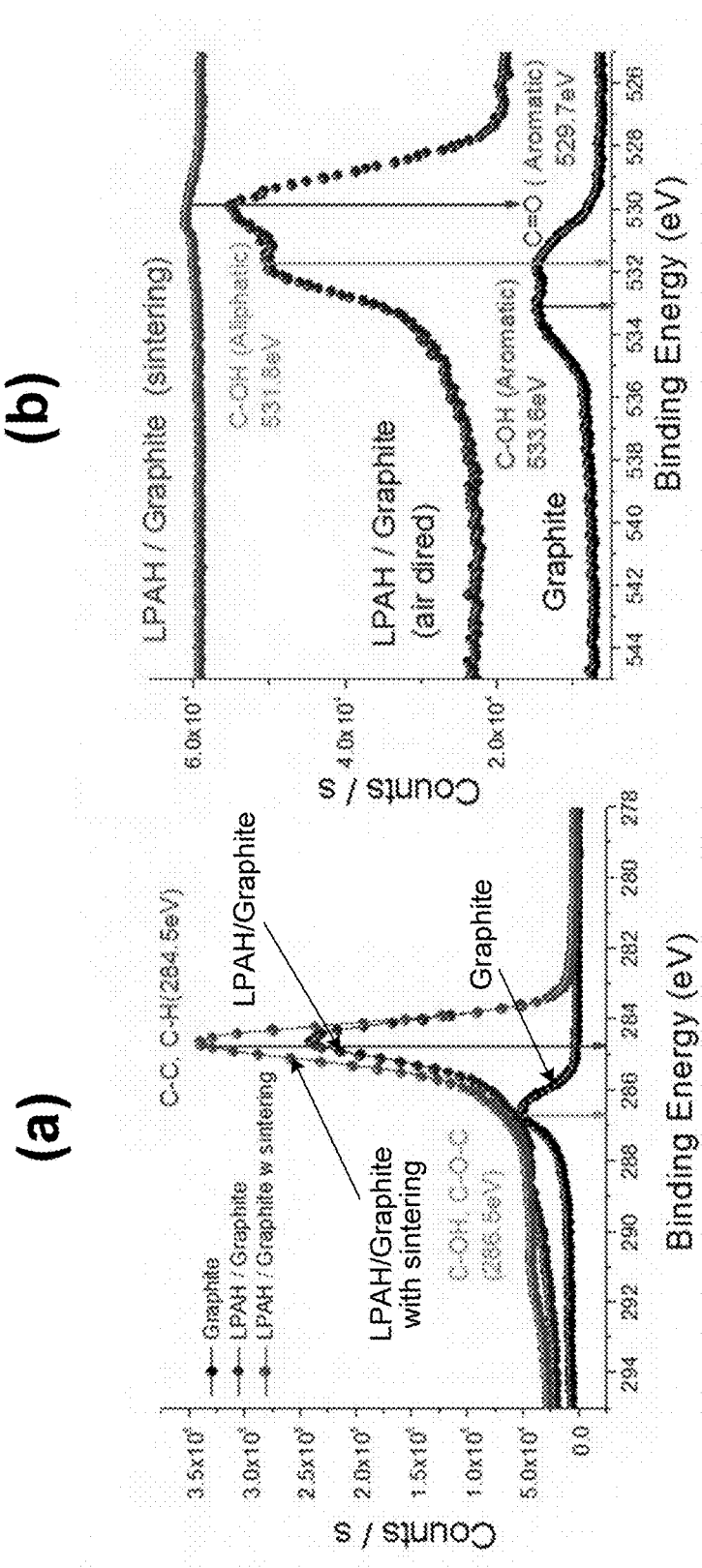
FIG. 11 shows XPS spectra of (a) C1s spectrum and (b) O1s spectrum for graphite, air dried LPAH/graphite and sintered LPAH/graphite according to one embodiment of the invention.

According to a charge reference for XPS spectra on the adventitious carbon element, C1s spectrum can be divided into four peaks with different energy intensity: the peak at 284.6 eV indicated hydrocarbons (C—H, C—C); the characteristic peak at 286.2 eV related to phenol or ether carbons (C—O); the characteristic peak at 288.1 eV denotes carbonyl carbons (C═O); and the peak at 289.9 eV is for carboxyl carbon (O—C═O) components [58-60]. From this reference, the relative content of C1s can be obtained from their peak-split results. C1s XPS spectrum of LPAH film showed a peak at 284.6 eV, as shown in FIG. 11(a), corresponding to large amounts of sp3 carbon with C—C bonds, while a graphite film exhibited the oxygen-containing group (at 286.5 eV). In addition, a little peak of air dried LPAH film (at 288.1 eV) emerged from the surfactant.

The results of O1s spectrum can be seen in FIG. 11(b). From reference, it is found that oxygen bound to organic components can range in binding energy from as low as 530.9 eV to as high as 533.8 eV (corrected here to C 1s (C—C, C—H) at 284.8 eV). The more common organic oxygen species (alcohols, esters, ketones, ethers and organic acids) are found in a range from 532.0-533.7 eV [61]. As it can be expected from the C1s spectrum, sintered LPAH film showed little oxygen content or substantially no oxygen content. Experimentally, oxygen will always be present on samples exposed to the atmosphere, either due to adventitious contamination, oxidation or water. Thus, the existence of the small oxygen peak can be understood by a detectable quantity of adventitious carbon contamination. And the aliphatic peak(C—OH) of air dried LPAH film can be explained by the existence of amphiphilic triblock copolymers poly(ethylene oxide)-poly(propylene oxide)-poly(ethylene oxide), often denoted as PEO20-PPO70-PEO20 (commercialized under the generic name P123). However, the sintered LPAH film itself showed substantially no oxygen content.

The XPS characterization clearly indicates that the LPAH film is substantially devoid of oxygen atoms.

Preparation of the Electrodes and DSSC Assembly

Anode:

Hydrothermal prepared TiO$_2$ nanoparticles (NP) were coated on the FTO glass substrate as the anode electrode [3]. Before soaking the TiO$_2$ NP film in the dye solution, the TiO$_2$ NP film was etched in plasma to expand the nano channels and pores of the TiO$_2$ NP film to increase the filtration of the plastic electrolyte. It was noted that the excess fluorine atoms in the dry etching process also serve to passivate the surfaces of the TiO$_2$ NP of the film [4]. Through this fluorine treatment processing, the optimized TiO$_2$ NPs film for a plastic DSSCs was obtained. The etched TiO$_2$ NP electrode was immersed in the ethanol solution containing purified 3×10$^{-4}$ M cis-di(thiocynato)-N,N'-bis (2,2'-bipyridyl-4-caboxylic acid-4'-tetrabutylammoniumcarboxy late) ruthenium (II) (N719, Solaronix) for about 18 hours at room temperature. The dye-adsorbed $TiO_2$ electrode was rinsed with ethanol and dried under a nitrogen flow. Accordingly, the anode electrode was fabricated.

Conventional Cathode and Choice of Surfactants for LPAH:

The conventional counter-electrode was produced by using a FTO glass substrate with a thin layer of an about 5 mM solution of $H_2PtCl_6$ in isopropanol, and this structure was heated at about 400° C. for about 20 minutes.

To replace the platinum catalyst, an optimal surfactant needs to be identified to homogeneously disperse the LPAH. In this exemplary embodiment, three surfactants were chosen as LPAH dispersants: Triton X ($C_{14}H_{22}O(C_2H_4O)_n$, Aldrich), Sodium dodecyl sulfate (SDS, Aldrich) and Pluronic P-123 (BASF Corporation). These surfactants were dissolved in water/acetic acid solutions (about 10 wt %) by sonication. The carbon solutions (both Carbon Black and LPAH) were prepared by mixing about 0.1 g of these carbon materials and about 1000 μl of surfactant solution through stirring for about 20 hours. This solution was used to coat the FTO glass substrate, and in a similar way the solution was dried thoroughly by heating it at about 400° C. for about 20 minutes.

Conventional DSSC Assembly: For the study of the effect on different catalytic materials and surfactant, the anode substrate (FTO) and cathode substrate (FTO) were sealed together with thermal melt polymer film (about 24 μm thick, DuPont). The liquid electrolyte includes about 0.6 M of 1-butyl-3-methylimidazolium iodide (BMII), about 0.03 M of iodine, about 0.1 M of guanidiniumthiocyanate (GSCN) and about 0.5 M of 4-tert-butylpyridine (tBP) in acetonitrile and valeronitrile (about 85:15 v/v) was injected between two electrode. The typical active area of the cell was about 0.310 $cm^2$. The exact area of each photoanode was calibrated by an optical scanner under a resolution of about 600 dots per inch (dpi).

An all Carbon Cathode for DSSC:

FIGS. 1(a) and 1(b) provide a schematic diagram of an all carbon DSSC assembly where light (denoted by arrows) enters the cell through the FTO 110 and the dye coated $TiO_2$ NP (anode) electrode 120 and converted to charges which flow to the LPAH (140)/graphite (150) CE via the plastic electrolyte 130. The electrons are extracted from the anode electrode. Photos of the top and side views of such an all carbon DSSC are shown in FIG. 1(c).

For the cathode substrate, a graphite film was prepared by cutting a fine extruded graphite rod with about 0.14 Ωcm² of electrical resistivity (Poco Graphite, 2.25" outside diameter). On the top of this graphite substrate, a thin (about 1 microns) layer of the LPAH was introduced in the following way. A suspension of the LPAH was prepared by mixing about 0.1 g of the LPAH "soot" carbon materials and about 1000 μl of surfactant solution by stirring for about 20 hours. The suspension deposited onto the patterned graphite film substrate and sintered at about 400° C. for about 20 minutes. In order to make the sandwich cell, the Amosil 4 sealant was prepared by thoroughly mixing together a portion made of about 100 weight units of resin (labeled as R) with about 80 weight units of hardener (labeled as H). The edges of a patterned graphite film substrate were sealed by an adhesive polyimide tape (having a thickness of about 1 mm) and it also serve as a spacer for the cell. For curing of the epoxy, this cell was stored in the glove box for about 24 hour at room temperature. After curing the epoxy, as described in an earlier report [4], the plastic electrolyte was introduced into the cell by a sequential electrolyte filling process. This same fabrication procedure was used in the case of a platinized substrate for the CE of the conventional DSSC.

Electrical Measurements

The DSSC devices were evaluated under about 100 mW/cm² AM1.5G simulated sunlight with a class solar cell analyzer (Spectra Nova Tech.). A silicon solar cell fitted with a KG3 filter tested and certified by the National Renewable Energy Laboratory (NREL) was used for calibration. The KG3 filter accounts for the different light absorption between the dye sensitized solar cell and the silicon solar cell, and it ensures that the spectral mismatch correction factor approaches unity. The electrochemical impedance results were measured under the same light illumination with an impedance analyzer (Solartron 1260), and a potentiostat (Solartron 1287) when the device was applied at its $V_{oc}$. An additional low amplitude modulation sinusoidal voltage of about 10 $mV_{rms}$ was also applied between an anode and cathode of a device over the frequency range of about 0.05-150 k Hz. The J-V characteristics of the cells were measured using the masked frame method [6] that has been adopted to limit photocurrent over-estimation arising from light-guiding effects that occur as light passes through the conductive glass electrode. A mask (with 6×5 mm opening) was placed on top of the 6×5 mm active $TiO_2$ area of the cells.

Comparing the Physical Properties of Carbon Black and LPAH

Figure 2:
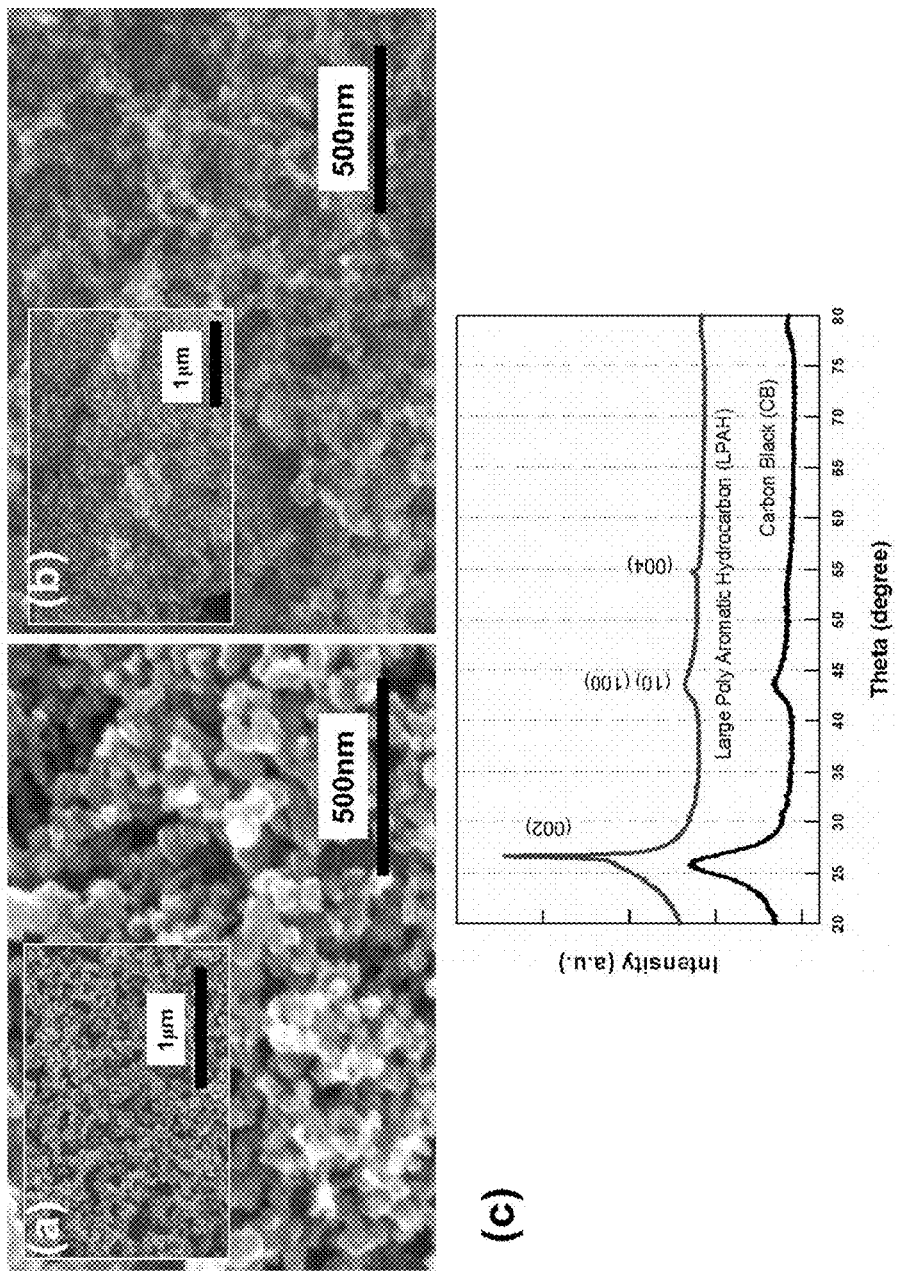
FIG. 2 shows (a) and (b) SEM images of the carbon black (CB) and large-effective-surface-area polyaromatic hydrocarbon (LPAH) for the counter electrode, respectively, and (c) XRD spectra of them, according to embodiments of the invention.

Carbon black has been extensively used to replace platinum as a catalyst. Here a comparison is made between it and the LPAH. Scanning electron microscopy (SEM) was used to compare the surface morphologies of carbon black (CB) and LPAH are shown in FIGS. 2(a) and 2(b), respectively. These images clearly reveal that the particle size of the LPAH film is much smaller than that of the CB film. FIG. 2(c) shows X-ray diffraction (XRD) patterns of both CB and LPAH films. Both carbon materials show a diffraction peak centered at 2θ=26°, which is very similar to the (002) diffraction of the graphite structure. It should be noted that the corresponding peak for the LPAH is much narrower indicating a better ordered structure like graphite. In the case of the LPAH, the peak at (100) and (004) diffraction intensities are also observed. From these measurements, it can be concluded that the LPAH includes nano graphite like ordered particles.

Figure 3:
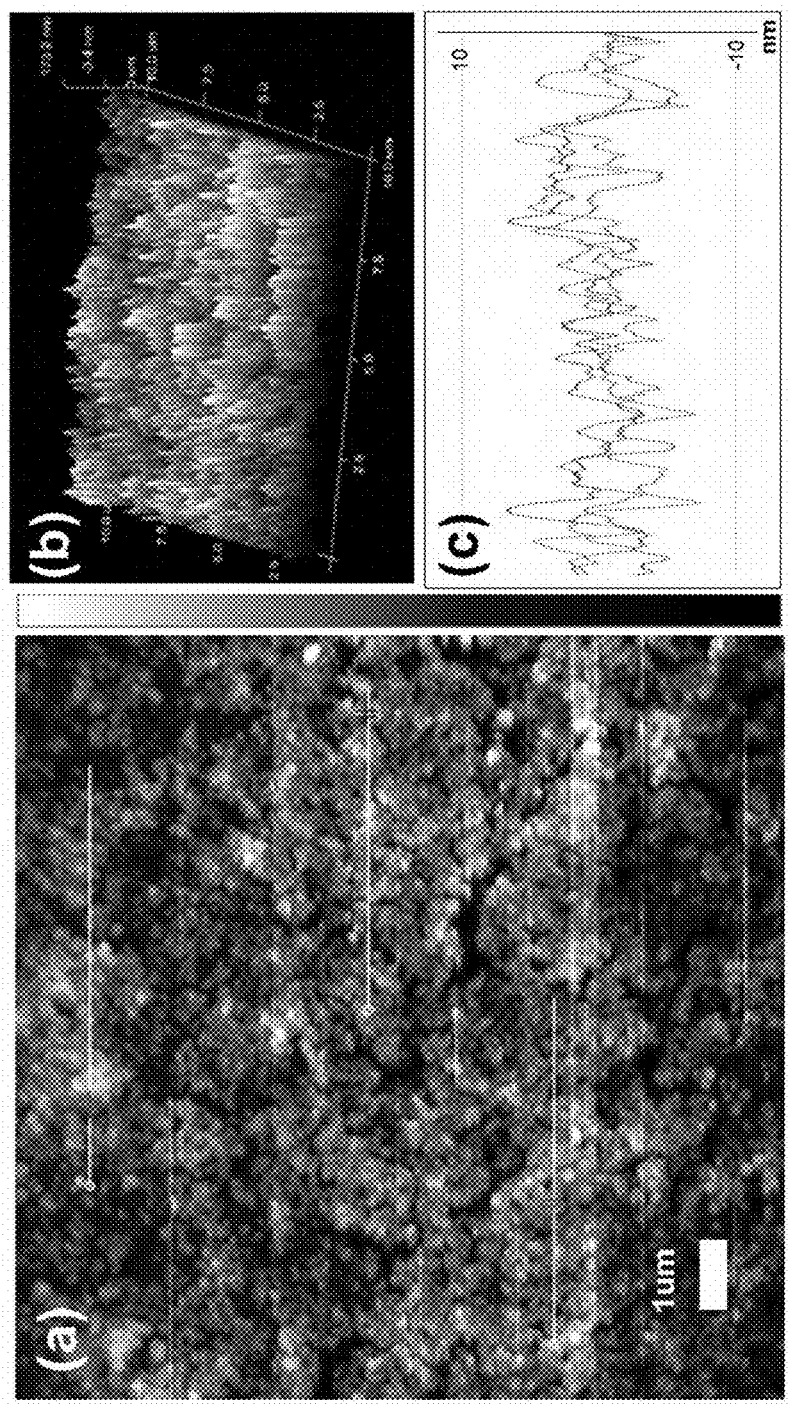
FIG. 3 shows AFM topographic images of hydrocarbon, (a) a top-view image, (b) a 3D image, and (c) average line-scan profiles, according to one embodiment of the invention.

To access the detailed information of the LPAH and its film morphology, AFM imaging analysis was performed. The LPAH particles have a uniform size of about 10 nm and they are well packed as a porous film as shown in FIG. 3(a). This result is in accord with the SEM image shown in FIG. 2(b). A 3D AFM image of the LPAH film is shown in FIG. 3(b). The film surface has very flat and smooth morphology with an average surface roughness ($R_a$) of about 37.4 nm and the root-mean-squared roughness ($R_q$) of about 0.41 nm. This result was obtained by analyzing selected line scans across the topology of the film surface as shown in FIG. 3(c).

According to the invention, the basic concept is to synthesize randomly-oriented nano particle films of LPAH to attain very large surface to volume ratio to enhance reactivity in an electro-chemical device. According to embodiments of the invention, the nano-particles have typical 10 nm diameter as measured by AFM shown in FIG. 3. As a result, the LPAH films have very large number of nano-channels for charge flow.

In addition, according to embodiments of the invention, a pure (carbon) layer of LPAH is formed of the LPAH soot material generated by a special Hydrogen arc process that is substantially devoid of oxygen. The whole LPAH film layer is a single layer made of the same LPAH soot material, which cannot be distinguished with multiple layers. It is well-known in the art that a surfactant can help to homogenize the carbon species for uniform deposition of the film. The post-deposition heating of the film is, in fact, to remove the organic surfactant. Thus, according to embodiments of the invention, the end product (the LPAH film) does not contain any surfactant. In certain embodiments, for thicker films, higher temperatures and longer times are used in order to remove all the surfactant from the film.

Choice of the Best Surfactant for LPAH

The LPAH synthesized by the hydrogen arc is highly hydrophobic and thus incline to aggregate. In order to make a thin film of the LPAH, a surfactant needs to be identified for use in the dispersion process to homogenize the LPAH and making it suspendable in water and minimize aggregation [27, 28]. In general, the dispersion via the adsorption of a polymer are considered to be stable as long as the individual particles do not aggregate or coagulate, and the block copolymers of high molecular weight polymers having two or more distinct regions of differing properties can be used as a vehicle for directing functional nanostructures onto surfaces [29-32]. Even though different types of surfactants are required for different carbon material application, in majority of the studies, the sodium dodecyl sulfate (SDS) [33, 34] or Triton X ($C_{14}H_{22}O(C_2H_4O)_n$) [16] has been used as the common surfactant for the DSSC counter electrode preparation. However, surprisingly little research has been reported on the optimization of the surfactant application. The reason for this is probably due to the fact that conversion efficiencies for various kinds of carbon based counter electrodes have not met with the breakthrough needed in spite of their unique physical and chemical properties.

Figure 4:
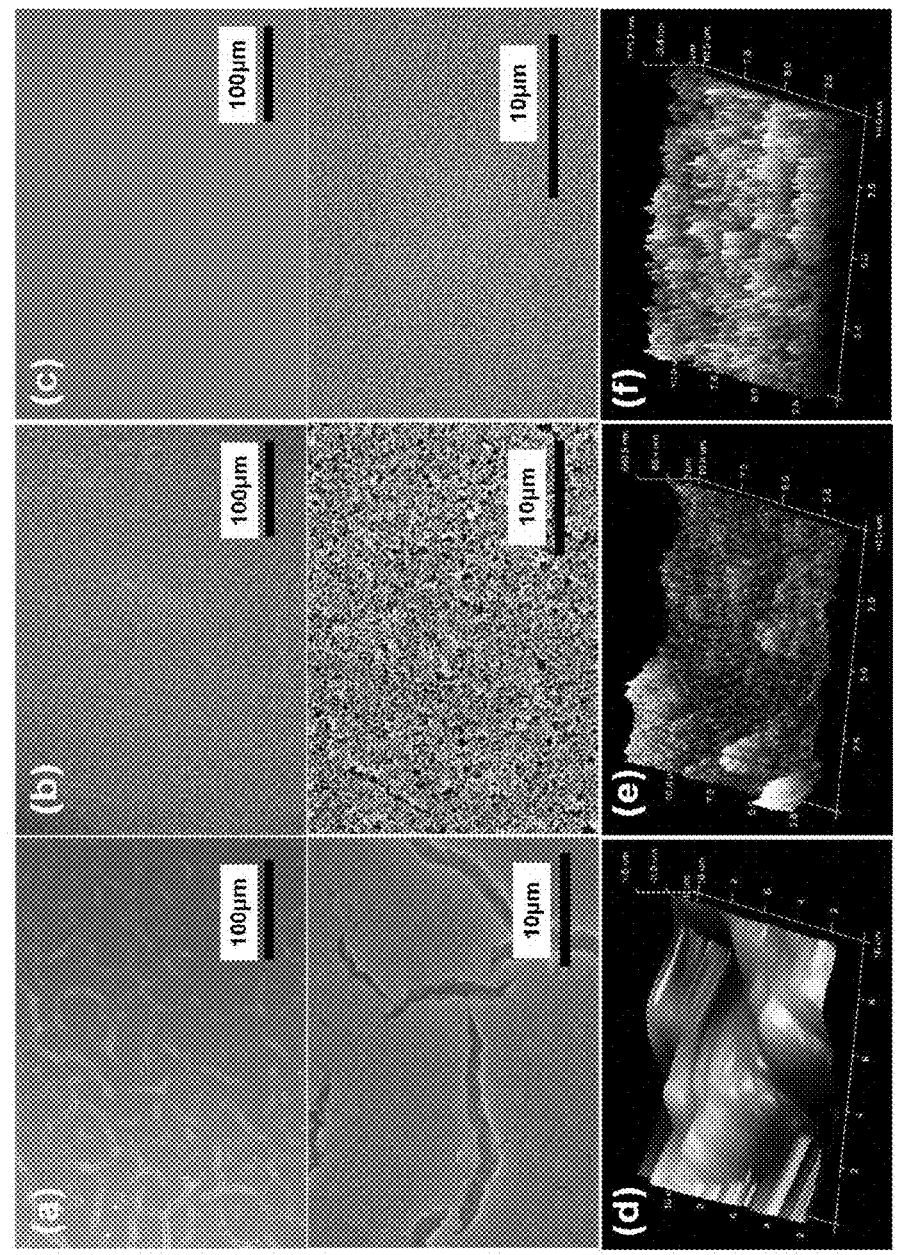
FIG. 4 shows (a)-(c) SEM images of a LPAH electrode with different surfactants, (a) SDS, (b) Triton X, (c) P123, and (d)-(e) AFM images of LPAH films with the different surfactants, according to embodiments of the invention.

In this exemplary embodiment, an amphiphilic triblock copolymers poly(ethylene oxide)-poly(propylene oxide)-poly(ethylene oxide), often denoted as $PEO_{20}$-$PPO_{70}$-$PEO_{20}$ (commercialized under the generic name, P123) is used for individually suspended LPAHs. P123 have been used in the design of low-k dielectrics coatings for catalysis or sensors [35]. SEM was used to compare different morphologies of the LPAH film when different surfactants were applied (FIG. 4). Films resulted from the LPAH suspended in the SDS resulted in cracked surfaces; films resulted from the LPAH suspended in Triton X surfactant showed quite smooth surfaces with no cracks, but the films are not uniform throughout the surface. However, for the case of P123, a much more smooth and uniform LPAH film was fabricated as the result of much denser packing of the material, as shown in FIG. 4(c).

For detailed information of the surface morphology of the LPAH films, AFM imaging was used to analyze the surface topography with Dimension Icon Scanning Probe Microscope (Veeco, USA) in the tapping mode. Surface topographical data can be obtained in one or two dimensions, i.e., z(x), z(x, y). The data were processed so as to obtain the surface roughness parameters, which includes the average surface roughness ($R_a$) and root-mean-square surface roughness ($R_q$) [36]. The $R_a$ is expressed as $$R_a = \frac{1}{n}\sum_{i=0}^{n}|z_i| R_a = \frac{1}{n}\sum_{i=0}^{n}|z_i|,$$

where $z_i$ is the height or depth of the ith highest or lowest deviation and n is the number of discrete profile deviations.

The root-mean-square surface roughness ($R_q$) is defined as the root-mean-square of the deviations in height from the profile mean by $$R_a = \sqrt{\frac{1}{n}\sum_{i=0}^{n}z_i^2} \quad R_q = \sqrt{\frac{1}{n}\sum_{i=0}^{n}z_i^2}.$$

The 3D AFM images of the LPAH films formed by different surfactants are shown in FIGS. 4(d)-4(f). The film surface used P123 surfactant, as shown in FIG. 4(f), has very flat and smooth morphologies with an average surface roughness ($R_a$) of about 37.4 nm and the root-mean-squared roughness ($R_q$) of about 0.41 nm compared with SDS and Triton X used carbon film. These results are in accord with the SEM images. To verify if the flat surface of carbon film is due packing densities, carbon mass has been measured on an about 6 $cm^2$ electrode. The result indicates that the measured specific volume mass (weigh content per unit area) of the P123 suspended LPAHs film were approximately about 70% and about 55% higher than that of observed for SDS and Triton-X suspended LPAHs film with the same thickness. The reason for this can be explained as follow; 1) generally, $PEO_y$-$PPO_x$-$PEO_y$ block copolymers are known to self-assemble in aqueous solutions into micelles in which a hydrophobic core of PPO cluster together within a nonpolar, hydrocarbon-like core, protected from the more polar solvent [32]. However, in case of the LPAHs suspension, it does not form micelles structure, but the PEO chains of the Pluronic polymers extend into the aqueous solutions well. At the vicinity of the LPAH surfaces they are affixed to the layer of poly(ethylene oxide) chains through adsorption of the surfactant [31]. This behavior that the triblock copolymers absorb onto hydrophobic parts of LPAH and extend their hydrophilic parts into the aqueous medium provides steric stability by the absorbed surfactant or polymer layer [28, 37]. Here, the layer thickness was strongly dependent on the hydrophilic PEO block size but less dependent on the hydrophobic PPO block size and the absorbed amount depended on the relative PPO and PEO block [31, 38]. Thus, the P123 surfactant with about 30 wt % PEO content and a slightly higher molecular weight (Mw: 5750) provides increased solubility [29]. Therefore, the formation of a steric barrier that prevents aggregation of the LPAH makes it easier to disperse in aqueous media and impedes LPAH aggregation when the suspension is deposited on glass [39].

Surface Area and Porosity Properties of LPAH

To have an efficient all carbon counter electrode, the effective exchange current densities at the CE must be comparable to that of the case of the platinum nano layer. For the case of carbon, its catalytic properties are not as high as platinum, thus the internal surface area of the carbon material must be increased. This requires the need to enhance the porosity of the carbon catalyst material [13].

Figure 5:
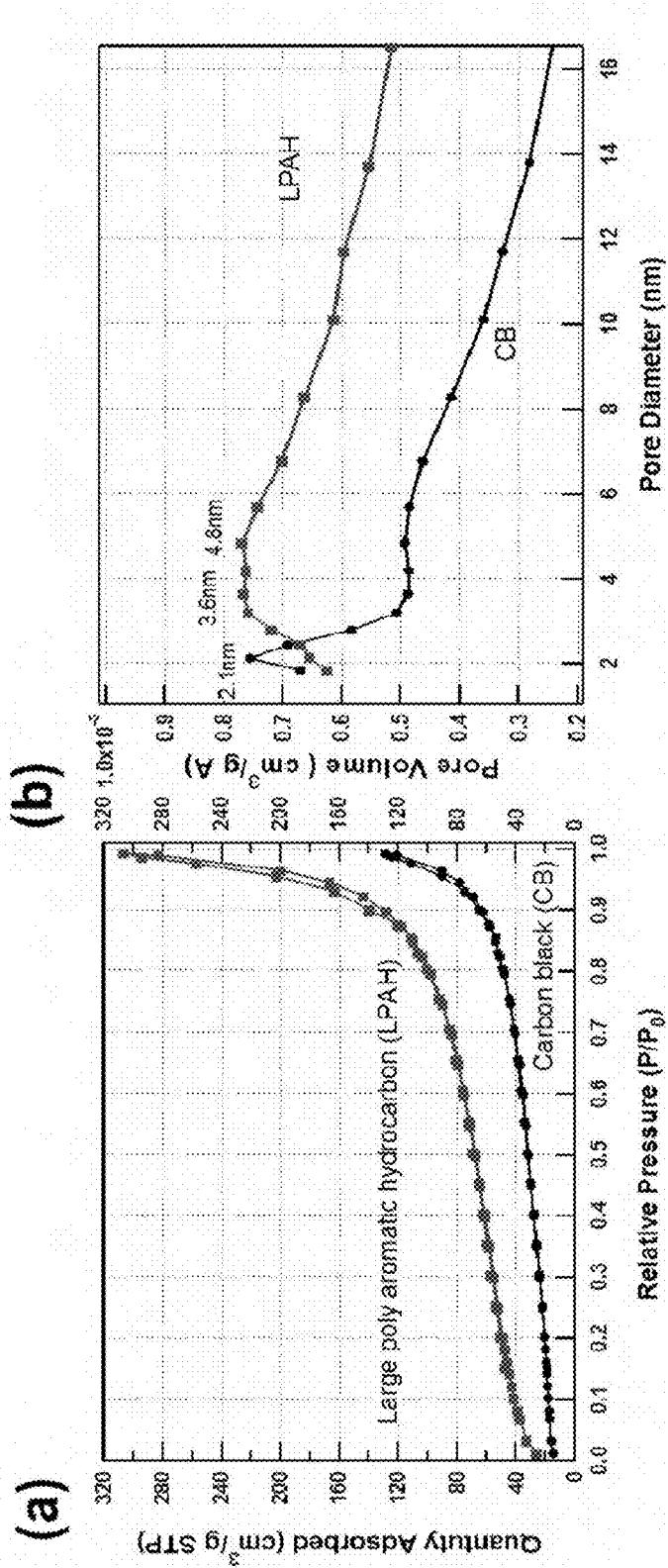
FIG. 5 shows (a) $N_2$ adsorption-desorption isotherms, and (b) Pore-size distributions of carbon black and large polyaromatic hydrocarbon, according to one embodiment of the invention.

In order to determine the catalytic properties of the LPAH, a study of the surface area and porosity properties was carried out. The $N_2$ absorption-desorption isotherm and the pore size distribution curve at about 77K of both the CB and the LPAH are shown in FIGS. 5(a) and 5(b). The as-prepared carbon materials displayed typical type-IV isotherm with $N_2$ hysteresis between the adsorption and the desorption curves, indicating the characteristic of mesoporous materials according to the IUPAC classification [40]. The type IV isotherm is common for the adsorption of gases. Usually the first concave part is attributed to the adsorption of a monolayer. For higher pressures more layers adsorb on the top of the first one. Eventually, if the pressure reaches the saturation vapor pressure, condensation leads to macroscopically thick layers. The LPAHs show a hysteresis loop at a high relative pressure (P/P$_0$=0.7-1) as well as an increase in the adsorbed amount at totally relative pressure, indicating the existence of partial mesopores in the sample. The pore size distribution curve in FIG. 5(b) also shows wide pore size distribution for LPAH. The surface area and pore sizes calculated with the Brunauer-Emmett-Teller (BET) and Barret-Joyner-Halenda (BJH) models from the adsorption branches are also listed in Table I.

port and electron capture by the $I_3^-$ at the TiO$_2$/electrolyte interface, diffusion of $I_3^-$ in the electrolyte, and charge transfer at electrolyte/catalytic materials-FTO interface, respectively. These components can be simplified from proposed in the DSSC model: R$_{FTO/TiO2}$ is the resistance of the FTO/TiO$_2$ contact and CPE$_1$ is the capacitance of this interface. TiO$_2$ network includes a diffusion element Z$_{W1}$ that is in series connected with the charge-transfer element

TABLE I

Characteristic of different counter electrode materials (platinum, carbon black and LPAH)

| | | BET & BJH analysis | | | Symmetric Cell | | | | Compete DSSC | | | | |
|---|---|---|---|---|---|---|---|---|---|---|---|---|---|
| Sample | d* (μm) | Surface area (m²/g) | Pore Volume (cm³/g) | Pore diameter (nm) | CPE:B (S.s $^\beta$) | CPE:β | R$_{ct}$ (Ωcm²) | J$_o$ (mA/cm²) | V$_{OC}$ (V) | J$_{sc}$ (mA/cm²) | FF (%) | EFF (%) | R$_{IR}$ (Ω) |
| (a) pt | — | — | — | — | 2.9 × 10$^{-5}$ | 0.87 | 0.61 | 22.0 | 0.824 | 13.4 | 73.8 | 8.12 | 17.1 |
| (b) CB | 7.5 ± 0.8 | 69.6 | 0.094 | 5.93 | 2.3 × 10$^{-5}$ | 0.76 | 70.3 | 0.190 | 0.804 | 11.5 | 68.9 | 6.35 | 111 |
| (c) LPAH | 3.2 ± 0.6 | 216.8 | 0.474 | 13.3 | 2.3 × 10$^{-3}$ | 0.85 | 2.12 | 6.31 | 0.820 | 13.1 | 73.2 | 7.89 | 21.9 |

*d is a thickness of catalytic layer

Table I shows that the measured specific surface area of the CB was about 69.6 m²g$^{-1}$ as compared to that of the LPAH which exhibited a more than 3-fold higher specific surface area of about 216.8 m²g$^{-1}$. Thus, the LPAH is expected to produce more catalytic sites for reduction of tri-iodide. Furthermore, the total BJHmesopore volume and the average pore diameter of the LPAH are about 0.47 cm³g$^{-1}$ and about 13.3 nm, respectively, while the CB shows the pore volume of about 0.09 cm³g$^{-1}$ and pore diameter of about 5.93 nm. Approximately about 124% enhanced pore diameters of the LPAH can be made accessible for the $I_3^-$ reactant [41].

Comparing the Electrochemical Properties of Carbon Black and LPAH

Figure 6:
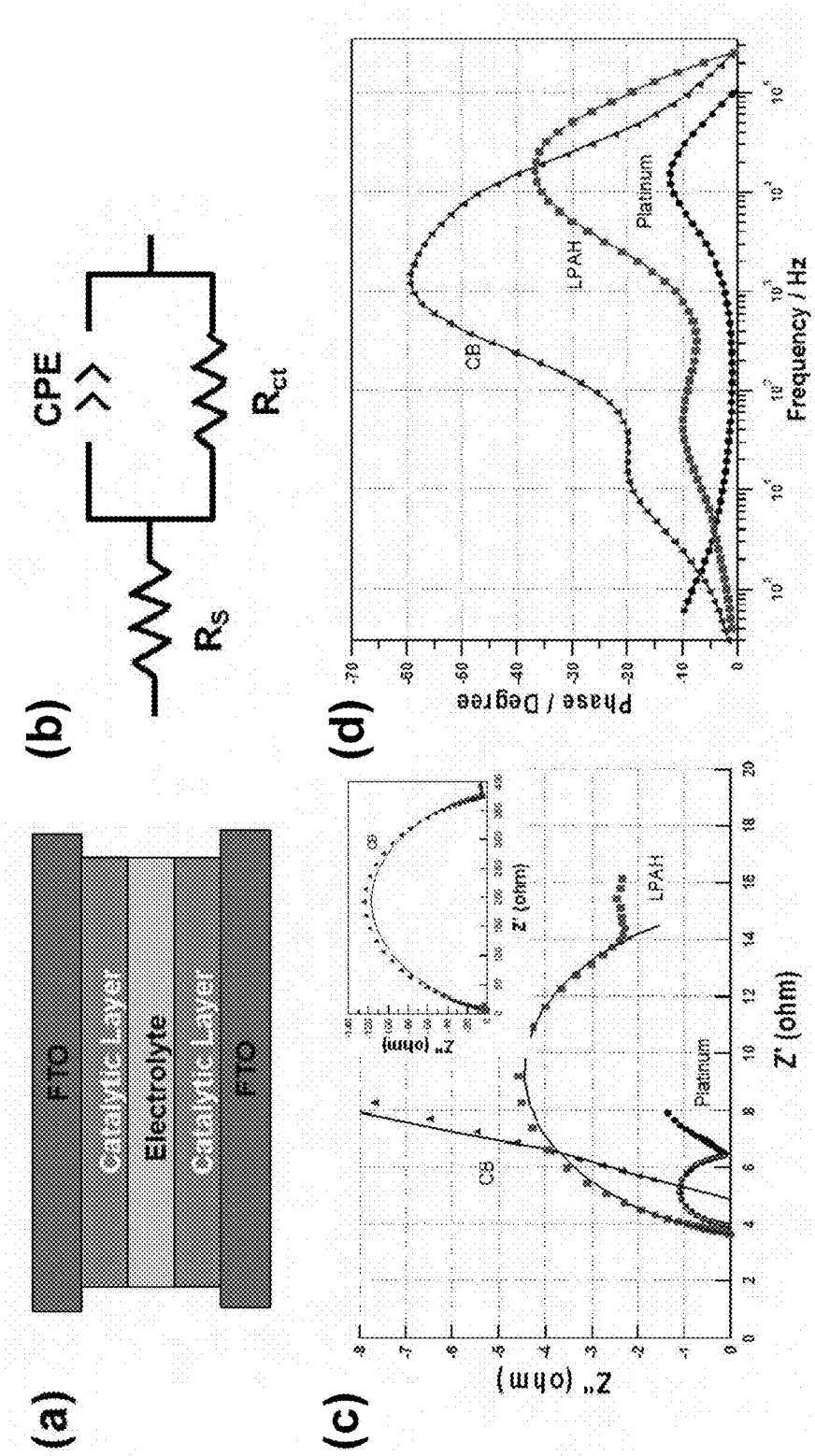
FIG. 6 shows (a) a schematic structure and (b) an equivalent circuit of a symmetrical cell used to fit the impedance spectra, (c) Nyquist plots, and (d) Bode plots of different counter electrode catalytic materials (platinum, carbon black and LPAH) prepared with identical electrodes, according to one embodiment of the invention.

In order to clarify the catalytic properties of LPAH, electrochemical reaction rates of the redox couple iodide/tri-iodide was measured with electrochemical impedance spectroscopy (EIS) using a symmetric cell with two identical electrodes. FIGS. 6(a) and 6(b) respectively show a sandwiched structure used in these measurements and the equivalent circuit used for fitting a symmetric cell, which includes Randles-type circuits (the charge transfer resistance (R$_{ct}$) at the LPAH/electrolyte with replacement of the double layer capacitance by a constant phase element (CPE) because of the elevated porosity of interfaces) and a series resistance (R$_s$). This approach has the advantage of yielding unambiguous results as isolating the impedance effects of anode processes and those of cathode processes, allowing, through data analysis with a simple equivalent-circuit model [42]. R$_{ct}$ is the charge-transfer resistance for electrochemical reactions. This resistance refers to the barrier through which the electron must pass across the electrode surface to the adsorbed species, or from the adsorbed species to the electrode [43]. The CPE reflects the interfacial capacitance, taking into account the roughness of the electrodes causing the interface to deviate from the behavior of a RC network [26, 44, 45]. The impedance of CPE is described as Z$_{CPE}$=B (iω)$^{-\beta}$(0≤β≤1) where, ω is the angular frequency, B and β are frequency-independent parameters of the CPE. β indicated the capacitance of CPE and the deviation from the semicircle probably due to the porosity of electrode surface, respectively. R$_s$ indicate the ohmic resistance of the FTO layer, the carbon layer, and the electrolyte.

Figure 7:
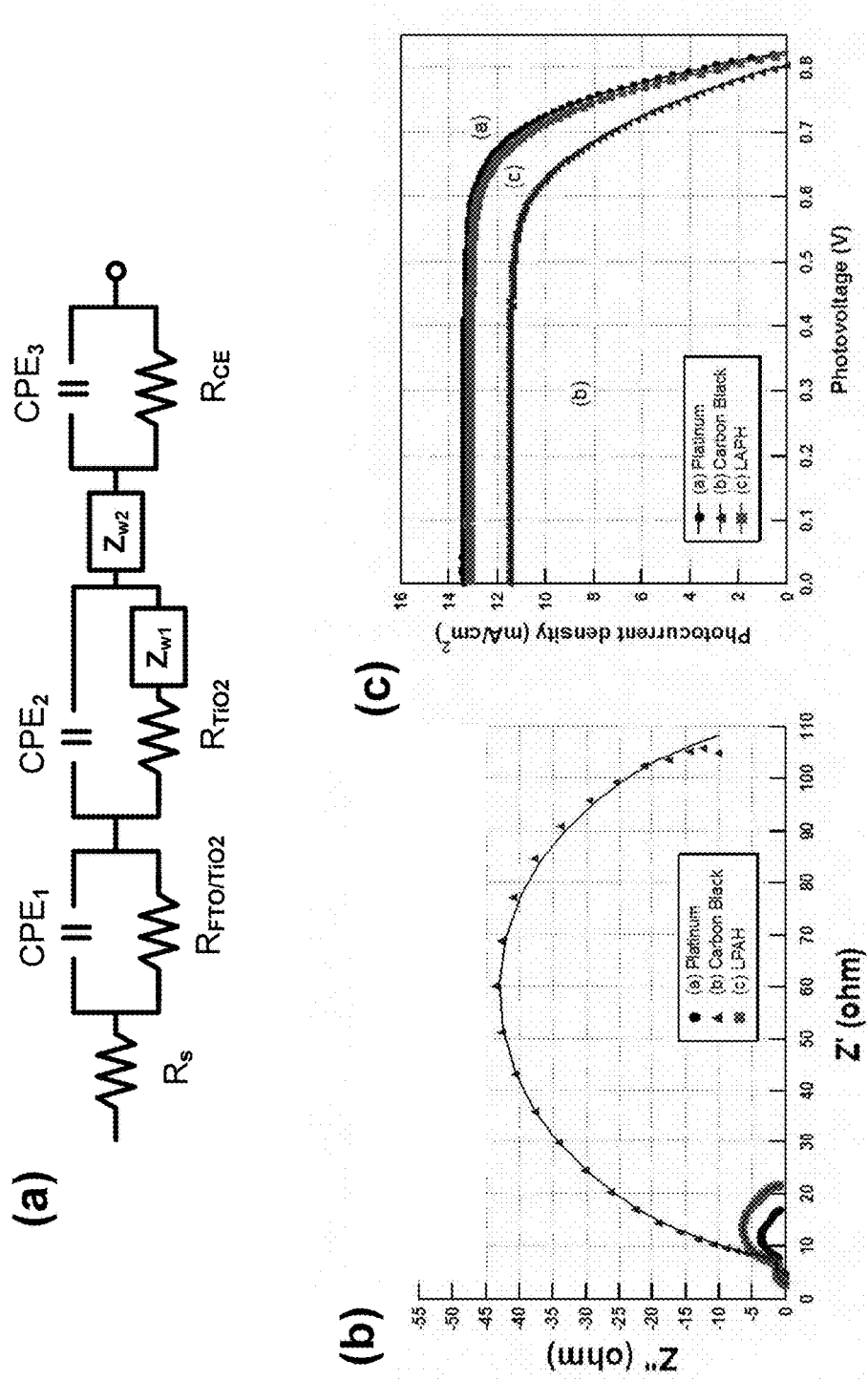
FIG. 7 shows (a) an equivalent circuit of the complete DSSC, (b) Nyquist plot of different counter electrodes of the complete DSSC, and (c) J-V characteristics of the complete DSSC, according to one embodiment of the invention.

FIG. 7(a) shows schematically the equivalent circuit of the complete solar cell. From left to right, it shows the electron transport at the FTO/TiO$_2$ interface, electron trans- R$_{TiO2}$, the two being in parallel with a capacitive (constant phase angle) element CPE$_3$. Z$_{W2}$ is the Warburg impedance describing the diffusion of $I_3^-$ in the electrolyte. R$_{CE}$ is the charge-transfer impedance at the counter electrode, and CPE$_2$ is the double layer capacitance at the electrolyte/catalytic materials-FTO interface. The insufficiently separated time constants and complexity for cathodic and anodic phenomena make it difficult to analyze accurate catalytic properties at the electrode surface. In the case of symmetric cells it can simplify this system, according to Kirchhoff's laws, to a single Randles-type circuit plus a series resistance [42]. Therefore, in this study, the kinetics or charge-transfer overpotential of reduction of $I_3^-$ at the counter electrode has been studied with a similar symmetric two-electrode system.

To have an effective solar cell, the counter electrode (CE) will require fast redox kinetics or should provide good support for a catalyst to obtain a high exchange current density (J$_0$) for reaction (1) without overpotential losses.

$$I_3^- + 2e^-_{anode} \rightarrow 3I^- \qquad (1)$$

The catalytic activity can be expressed in terms of the exchange current density (J$_0$), which is calculated from the charge-transfer resistance (R$_{ct}$) using the equation,

$$J_0 = RT/nFR_{ct}$$

in which R, T, n, and F are the gas constant, temperature (here T=300K), number of electrons transferred in the elementary electrode reaction 1 (n=2) and Faraday constant, respectively [26]. Here, the J$_0$ is a kinetic parameter that depends on the reaction and on the electrode surface upon which the electrochemical reaction occurs. The magnitude of the exchange current density determines how easily the electrochemical reaction can occur on the electrode surface. This can be estimated using alternating current (AC) impedance spectroscopy at open circuit voltage, and can be obtained from the charge-transfer resistance (R$_{ct}$) and a constant phase element (CPE) measured in the AC impedance spectra. A Zview software is available to fit the spectra and give the best values for equivalent circuit parameters. Therefore, the fitting and simulation of acquired data were achieved using Z-plot software.

The complex-plane impedance diagram is shown in FIG. 6(c). At both high and medium frequencies the complex-plane impedance is characterized by a well pronounced semicircle, while at the low-frequency range a tail appears. This tail's shape is strongly dependent on the value of the CPE exponent [43]. From this diagram, even though platinum shows the lowest charge transfer resistance, indicating better electrocatalytic activity, the value of the CPE exponent for LPAH is closer to that of the platinum electrode, indicating that LPAH electrode have a superior electrocatalytic activity compared to CB.

In the case of CB counter electrode with about 8 μm thickness, the charge transfer resistance for the $I_3^-/I^-$ redox reaction was very large (about 70.3 Ω cm$^2$) on a symmetric carbon black electrode, while the $R_{ct}$ value of LPAH based CE was about 2.12 Ω cm$^2$ at thickness of about 3 μm, which is even lower value than that of the best performance CB based CE, about 2.96 Ω cm$^2$ at thickness of about 20 μm reported by Murakami [21]. In general, the high $R_{ct}$ has a negative influence on the internal series resistance ($R_{IR}$) (as indicated by EIS analysis), the fill factor (FF), and the photocurrent ($J_{SC}$). This implies poor energy conversion efficiency in the complete DSSC.

Several papers have reported the strategies for improving the catalytic activity of CE materials [21, 17, 15, 47]. Basically, the carbon materials with a very high surface area and thicker carbon film(>14 μm) has also shown enhanced exchange current density. In their [Murakami, Grätzel] results, the electrodes including the higher exchange current density and thicker carbon film have also achieved a better performance. However in order to do this with disordered micropores in CB a few tens of micrometer of thick film is necessary to achieve a comparable charge transfer resistance ($R_{ct}$) at the CE electrode-electrolyte interface. In disordered micropores, the redox electrolyte has difficulty accessing the active sites of the CB. At the same time, diffusion of redox species in such a thick film causes mass transfer limitation; resulting in poor photovoltaic performance [13]. These issues hinder the application of CB as an effective counter-electrode.

In the case of LPAH film, however, the measured exchange current density ($J_0$) was about 33 times higher compared to the case of CB film (see Table I). At the same time the LPAH film was less than one half the thickness of the CB film. While CB based CE required a thicker layer due to their insufficient catalytic activity, the LPAH electrode have enough catalytic sites even with a thinner layer, and it can help to reduce the internal series resistance of devices. Thus, the high current density is attributed to its high internal active surface area and pore size of the LPAH film. Therefore, LPAH is an efficient counter electrode catalyst for tri-iodide reduction in DSSC.

The corresponding Bode phase plots of the cells with different counter electrodes are shown in FIG. 6(d). The phase shift of the peaks at the high frequency region is related to the charge transfer at the interfaces of electrolyte/counter electrode. A reduction from about 59.4° for CB based CE to about 36.6° for the LPAH based CE has been observed. At the same time the corresponding frequency peak positions for CB and LPAH are about 1504 Hz to about 20047 Hz respectively. This indicates the electrochemical properties of LPAH are much improved with respect to that of CB [48]. As a result, from both the Nyquist plots and Bode phase plots, it shows that the LPAH would speed up the $I^-/I_3^-$ redox reaction, leading to better to fill factor and solar cell performance.

FIGS. 7(b) and 7(c) respectively shows fitted Nyquist plot and J-V curves of the complete DSSCs using Pt, CB and LPAH as counter electrodes. The detailed internal series resistance ($R_{IR}$) and photovoltaic parameters from these curves are summarized in Table I. The internal series resistance elements are related to the sheet resistance of FTO ($R_0$), the charge transfer processes at the counter electrode ($R_1$), the charge transportation at the TiO$_2$/dye/electrolyte interface ($R_2$), diffusion in the electrolyte ($R_3$). As solar cells generally operate under direct current conditions, the capacitances can be ignored. The internal series resistance ($R_{IR}$) can then be described as $R_{IR}=R_0+R_1+R_2+R_3$. In accord with the results of measured electrocatalytic properties, the complete DSSC used by platinum counter electrode shows a lower internal resistance and higher energy conversion efficiency than either CB and LPAH counter electrodes, owing to its high exchange current density for reaction (1) [12, 26, 49]. However, the overall internal series resistance and efficiency of the LPAH counter electrode is very close to that of Platinum electrode and show much higher values than that of the CB electrode. To be specific, the advantages of a LPAH counter electrode is due to its large effective surface area, porosity, and thus the improved catalytic properties can help to achieve better photovoltaic performance. Even though the LPAH counter electrode shows a lower catalytic property compared with the platinum DSSC, it has similar values for $V_{oc}$, fill factor and slightly lower values of photocurrent density and efficiency. However, compared to CB based DSSC, the LPAH based DSSC showed improved FF and $J_{sc}$, as well as 5 times lower internal series resistance. As a result, the LPAH counter electrode (with FTO) achieves an overall energy conversion efficiency of about 7.89%, which is higher than 6.35% achieved for the CB counter electrode (with FTO) devices.

Table II shows the electrocatalytic activity of symmetrical dummy cells with LPAH films having different surfactants coated on FTO glass. The LPAH electrode with P123 has the lowest $R_{CT}$ and the low β number of 0.85 for the CPE. The calculated exchange current density, $J_o$ has increased more than 6-fold compared to the SDS suspended LPAH film. The decreased (by about 30%) sheet resistance ($R_S$) of the LPAH counter electrode with P123, compared with that of SDS and Triton X, indicates the interconnection of LPAH was improved and it contributes to the improvement of electron transfer at counter electrode [50].

TABLE II

Electrocatalytic properties and Photovoltaic parameters of DSSCs with different surfactants

| | Electrocatalytic Activity (Symmetric Cell) | | | | EIS measurement (Complete Cell) | | | | | JV characteristics (Complete Cell) | | | | | |
|---|---|---|---|---|---|---|---|---|---|---|---|---|---|---|---|
| Surfactant | $R_s$ (Ω) | CPE:B (S.s$^β$) | CPE:β | $R_{CT}$ (Ωcm$^2$) | $J_o$ (mA/ cm$^2$) | $D_{eff}$ 10$^{-5}$ cm$^2$s$^{-1}$ | $k_{eff}$ (Hz) | $R_k/R_w$ | $n_s$ (10$^{18}$ cm$^{-3}$) | $R_{IR}$ (Ω) | $V_{OC}$ (V) | $J_{sc}$ (mA/ cm$^2$) | FF (%) | EFF (%) | $R_a$ (nm) | $R_q$ (nm) |
| (a) SDS | 4.75 | 2.7 × 10$^{-6}$ | 0.86 | 16.6 | 0.805 | 2.46 | 9.46 | 1.54 | 1.20 | 60.4 | 0.794 | 11.3 | 47.6 | 4.27 | 478 | 571 |
| (b) Triton X | 4.70 | 1.8 × 10$^{-6}$ | 0.89 | 4.96 | 2.69 | 13.0 | 23.8 | 3.24 | 1.11 | 31.2 | 0.809 | 12.3 | 65.4 | 6.51 | 88.5 | 122 |

TABLE II-continued

Electrocatalytic properties and Photovoltaic parameters of DSSCs with different surfactants

| | Electrocatalytic Activity (Symmetric Cell) | | | | EIS measurement (Complete Cell) | | | | | JV characteristics (Complete Cell) | | | | | |
|---|---|---|---|---|---|---|---|---|---|---|---|---|---|---|---|
| Surfactant | $R_s$ ($\Omega$) | CPE:B (S.s$^\beta$) | CPE:$\beta$ | $R_{CT}$ ($\Omega$cm$^2$) | $J_o$ (mA/ cm$^2$) | $D_{eff}$ 10$^{-5}$ cm$^2$s$^{-1}$ | $k_{eff}$ (Hz) | $R_k/$ $R_w$ | $n_s$ (10$^{18}$ cm$^{-3}$) | $R_{IR}$ ($\Omega$) | $V_{OC}$ (V) | $J_{sc}$ (mA/ cm$^2$) | FF (%) | EFF (%) | $R_a$ (nm) | $R_q$ (nm) |
| (c) P123 | 3.64 | 2.3 × 10$^{-3}$ | 0.85 | 2.12 | 6.31 | 6.87 | 11.9 | 3.42 | 3.10 | 21.9 | 0.820 | 13.1 | 73.2 | 7.89 | 37.4 | 47.9 |

Figure 8:
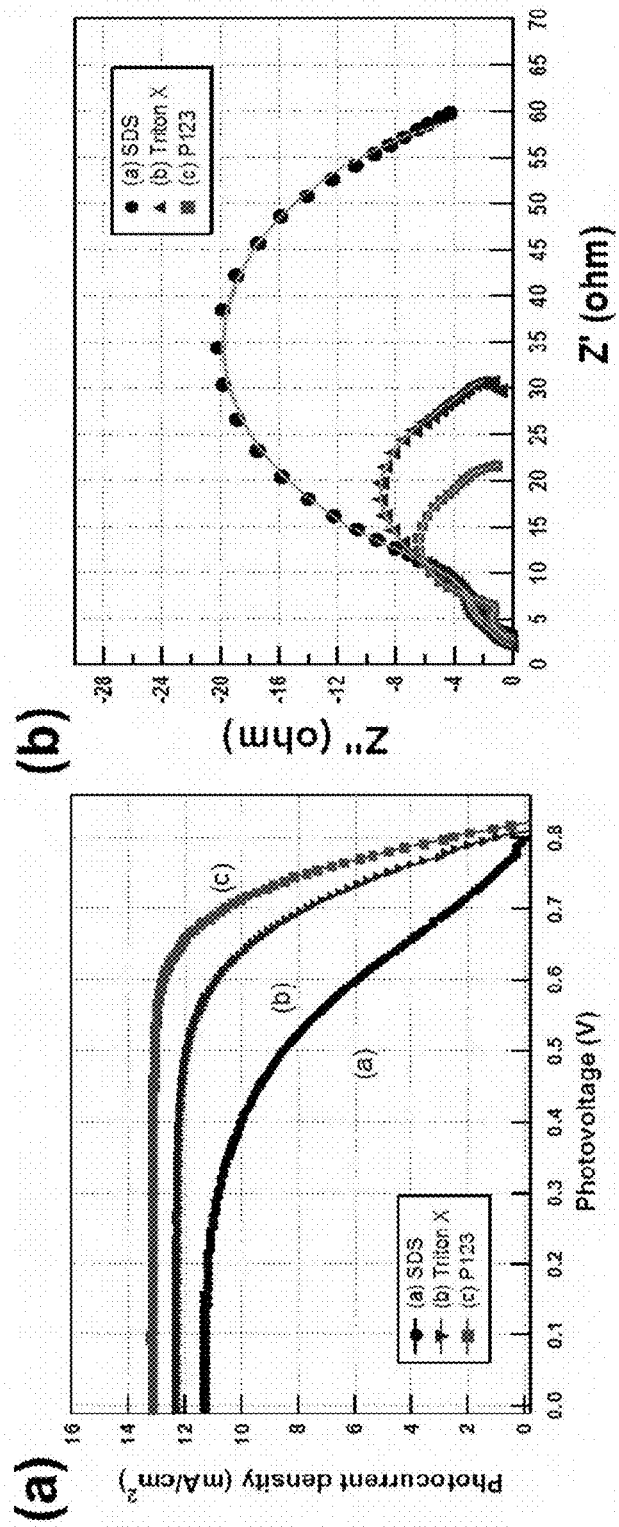
FIG. 8 shows (a) J-V characteristics of a DSSC, and (b) electrochemical impedance spectroscopy (EIS) plots for each of the J-V curves with the best-fit model having different surfactant, according to one embodiment of the invention.

The improved electrocatalytic properties and sheet resistance are also reflected in the reduced semicircle diameter as seen in the Nyquist plot, as shown in FIG. 8(b), on the complete DSSC. The $R_{IR}$ value of LPAH electrode with P123 surfactant was lower compared to that of SDS and Triton X by about 176% and about 42.6%, respectively. The low value of $R_{IR}$ at the interface between electrolyte and the LPAH electrode for redox reaction would result in small energy loss for electron transfer and thus slight photocurrent density enhancement.

In order to have a more in-depth understanding of the charge transport kinetics of the cell, the kinetic model of Adachi et al. [51] (who consolidated the models developed by Kern et al [52] and Bisquert et al. [44, 53]) was adopted. The best fit parameters from this model are tabulated in Table II. This includes the parameters for electron kinetics in DSSC. The direct current resistance at $\omega=0$ is given by a simple function of both the electron transport resistance in TiO$_2$, $R_w=k_BT/q^2An_s\times L/D_{eff}$=Con×L/D$_{eff}$, and the charge-transfer resistance in recombination of electron at TiO$_2$/electrolyte interface, $R_k$=Con×1/Lk$_{eff}$, where $k_B$, T, q, A, L and $n_s$ represent Boltzmann constant, absolute temperature, charge of an electron, the electrode area, thickness of TiO$_2$ film and the steady-state electron density in the conduction band, respectively. The first-order reaction rate constant for the loss of electrons, $k_{eff}$, which is estimated to be equal to the peak frequency of the central arc, $\omega_{max}$ and the effective electron diffusion coefficient, $D_{eff}=(R_k/R_w)\times L^2k_{eff}$. This model calculation and data fitting have provided some physical insight into the differences in the transport properties on LPAH electrode with the different surfactant.

From this model, low $k_{eff}$, high $R_k/R_w$, high $D_{eff}$ and high $n_s$ are necessary condition to attain highly efficient DSSC. In the model calculation and data fitting, LPAH electrode with Triton X shows the highest $D_{eff}$ and $k_{eff}$ values, while SDS surfactant has the lowest $D_{eff}$ and $k_{eff}$ values. Consequentially, the $R_k/R_w$ value of electrode with P123 was about 121%, and about 5.3% higher compared to that of the SDS and Triton X respectively. Therefore, charge density in TiO$_2$ conduction band ($n_s$) of LPAH electrode with P123 was about three times greater than either SDS or Triton X surfactant. In addition, it is also noted that the internal resistance, $R_{IR}$, the lowest for P123 surfactant as seen in Table II. These differences show that the P123 surfactant is more effect on the transport properties of the cell.

In accord with the electrocatalytic and EIS measurement results, the DSSC using P123 suspended LPAH electrode exhibit significantly improved efficiency, as shown in FIG. 8(a). The cell with P123 suspended electrode has its $V_{oc}$ increased from about 0.794 to 0.820 V, $J_{sc}$ increased from about 11.3 to about 13.1 mA/cm$^2$ and FF increased from about 47.6 to about 73.2% as compared to SDS suspended LPAH electrode based DSSC. The efficiency enhancement was attributed mainly to the improved fill factor, and show slightly better photocurrent and open circuit voltage. These results give a large increase in the overall cell efficiency from about 4.27 to about 7.89%. (Table II)

An All Carbon CE DSSC with Plastic Electrolyte

In this exemplary embodiment, an all carbon CE for DSSCs has been fabricated with a plastic electrolyte to improve both efficiency and stability (see FIG. 1) [4]. For evaluating the effectiveness of all carbon CE DSSC, a comparison study of three different types of CE was carried out. They include: (i) Platinum/FTO glass, (ii) LPAH/FTO glass, and (iii) LPAH/GF.

Figure 9:
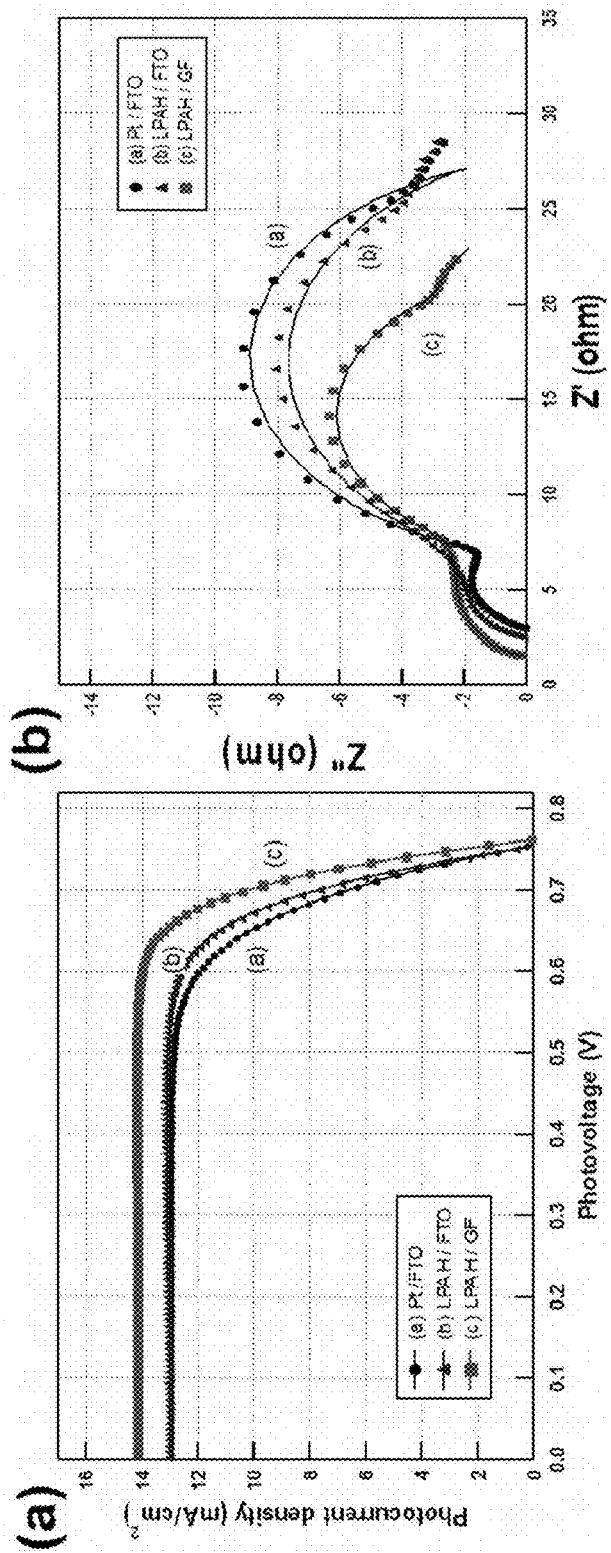
FIG. 9 shows comparison of the performance of DSSCs with three different CEs (a) J-V Characteristics, and (b) EIS plots for each of the J-V curves, according to one embodiment of the invention. These measurements used a masked frame.

FIG. 9(a) shows the J-V plots of the three different CE DSSCs. All samples were measured by using the masked frame for avoiding overestimations of the conversion efficiency. The corresponding EIS analysis provides a measure of the internal resistance in the cells. The sheet resistance ($R_{sq}$, 1×1 cm$^2$) of graphite film has about 22 times lower values than that of the FTO glass. Table III lists results of the EIS and JV characteristics on different counter electrodes.

TABLE III

Results of the EIS and JV characteristics on different counter electrodes

| | JV characteristics (masked) | | | | | | |
|---|---|---|---|---|---|---|---|
| | $V_{OC}$ (V) | $J_{sc}$ (mA/ cm$^2$) | FF (%) | EFF (%) | $R_{sq}$ ($\Omega/\square$) | $R_{sh}$ (Ohm) | $R_{IR}$ (Ohm) |
| (a) Pt on FTO | 0.754 | 12.9 | 73.7 | 7.15 | 19.9 | 2.90 | 29.3 |
| (b) LPAH on FTO | 0.753 | 12.9 | 77.3 | 7.50 | 23.7 | 2.38 | 28.3 |
| (c) LPAH on GF | 0.761 | 14.1 | 80.0 | 8.63 | 1.3 | 1.37 | 23.0 |

In the case of the LPAH deposited graphite substrate, the sheet resistance was increased by approximately 10% compared with the bare graphite substrate, while the total internal series resistance ($R_{IR}$) was dramatically decreased by about 93.3%. The reason may be due to the improved adhesion between the LPAH and graphite film [54]. In general, a higher internal resistance in a device has a negative effect on the fill factor (FF) and photocurrent ($J_{SC}$). As a result of the total resistance reduction, the all carbon CE DSSC gives a $J_{sc}$ of about 14.1 mA/cm$^2$, a $V_{oc}$ of about 0.761 V, a fill factor of about 80.0% and efficiency of about 8.63%. The efficiency of the DSSC with all carbon CE DSSC was relatively improved by about 20.7%, and about 15.1%, compared with those based on platinum and LPAH based FTO electrodes, respectively. To our knowledge this is the best performing DSSC with plastic electrolyte.

In summary, the large-effective-surface-area poly aromatic hydrocarbon (LPAH) produced by a hydrogen arc-system was successfully used as an efficient catalytic layer for the counter electrode. The LPAH particles have a uniform size of about 10 nm and they exhibit more than 3-fold higher specific surface area and about 45% enhanced pore diameters compared with that of CB particles. The increased active surface to volume ratio of the LPAH layer makes it possible to accelerate the charge specie diffusion and catalytic reactions. Therefore, a LPAH CE based DSSC shows a superior electrocatalytic properties and the overall energy efficiency is close to that of the platinum electrode. The use of a P123 surfactant for dispersing LPAH particles helps make the LPAH film much more uniform and a denser material. In addition to replacing platinum with the LPAH as the catalyst, the FTO substrate for the CE was also replaced by a graphite film to further reduce the cell internal resistance and thus improving cell efficiency. As such, an all carbon CE delivers near 9% of energy conversion efficiency as measured with a masked frame. This efficiency is about a 20.7% improvement compared to the case of a Pt/FTO counter electrode based DSSC.

EXAMPLE II: BATTERIES

Batteries (either lithium ion or lithium-air), super capacitors, and fuel cells all require the use of carbon based electrodes. Carbonaceous materials, especially graphite, are the most used anode materials for rechargeable lithium batteries (LIBs). They can avoid the problem of lithium dendrite formation by reversible intercalation of lithium into carbon host lattice, which provides good cycle-ability and safety for lithium battery anodes. However, graphite has a limited theoretical capacity of about 372 mAh/g since the most lithium-enriched intercalation compound of graphite only has a stoichiometry of $LiC_6$. To increase the energy and power densities of LIBs, nanostructured carbonaceous anode materials, such as one dimensional (1D), two-dimensional (2D), and porous carbon based anodes, have been developed to create more active spaces or sites for Li storage.

Porous carbons with different pore sizes ranging from nanometer to micrometer scale are promising anode materials for LIBs due to their high surface areas and open pore structures. The desirable characteristics of the materials are the effective diffusion pathways for lithium ions due to the formation of percolation networks from interconnected nanopores, reasonable electrical conductivity provided by the well-interconnected carbon walls, large amount of active sites for Li storage, and minimized mechanical stress for volume expansion/contraction during lithium intercalation/deintercalation. Because of these unique merits, porous carbons often show prominently increased capacities in comparison with traditional graphitic carbons.

According the embodiments of to the invention, a battery with a nanostructured carbon electrode having a LPAH thin film has the unique properties better than that of the convectional battery.

EXAMPLE III: SUPERCAPACITORS

Investigations into supercapacitor design and development began with a patent assigned to General Electric in 1957 [56], which described the manufacturing of a device using porous carbon electrodes flooded with sulphuric acid. The device employed an electrostatic charge mechanism described by electric double-layer capacitance (EDLC) modeling, to develop a capacitive charge at the electrode/electrolyte interface. Principal aspects to consider regarding the physical attributes that contribute to EDLC include:

A large active area in contact with the electrolyte for capacitive charging;
  Good electrical conductivity to reduce the loss in power from internal resistance;
  Manipulation of the pore size pore distribution to complement the anticipated ion size of the electrolyte;
  Interconnecting pores for ion mobility, accessibility and reduction in diffusion path length; and
  Surface wet-ability to enhance pore flooding, improving the specific surface area utilized [56].

One key aspect of the present invention is to utilize the high surface area in carbon materials, which upon further improvements enables a previously unattainable high specific capacitance to be achieved.

As a primary electrode material for over 40 years, easily polarized carbon possesses a number of unique properties that are well suited for their use in supercapacitor devices. In addition to the benefits of low precursor costs and the wide availability of base materials, recently developed nanostructured carbon materials used for supercapacitor application show promise with (having) improved mechanical and electrical properties and better control of their design and structure compared with the commercial activated carbon material currently used.

Figure 10:
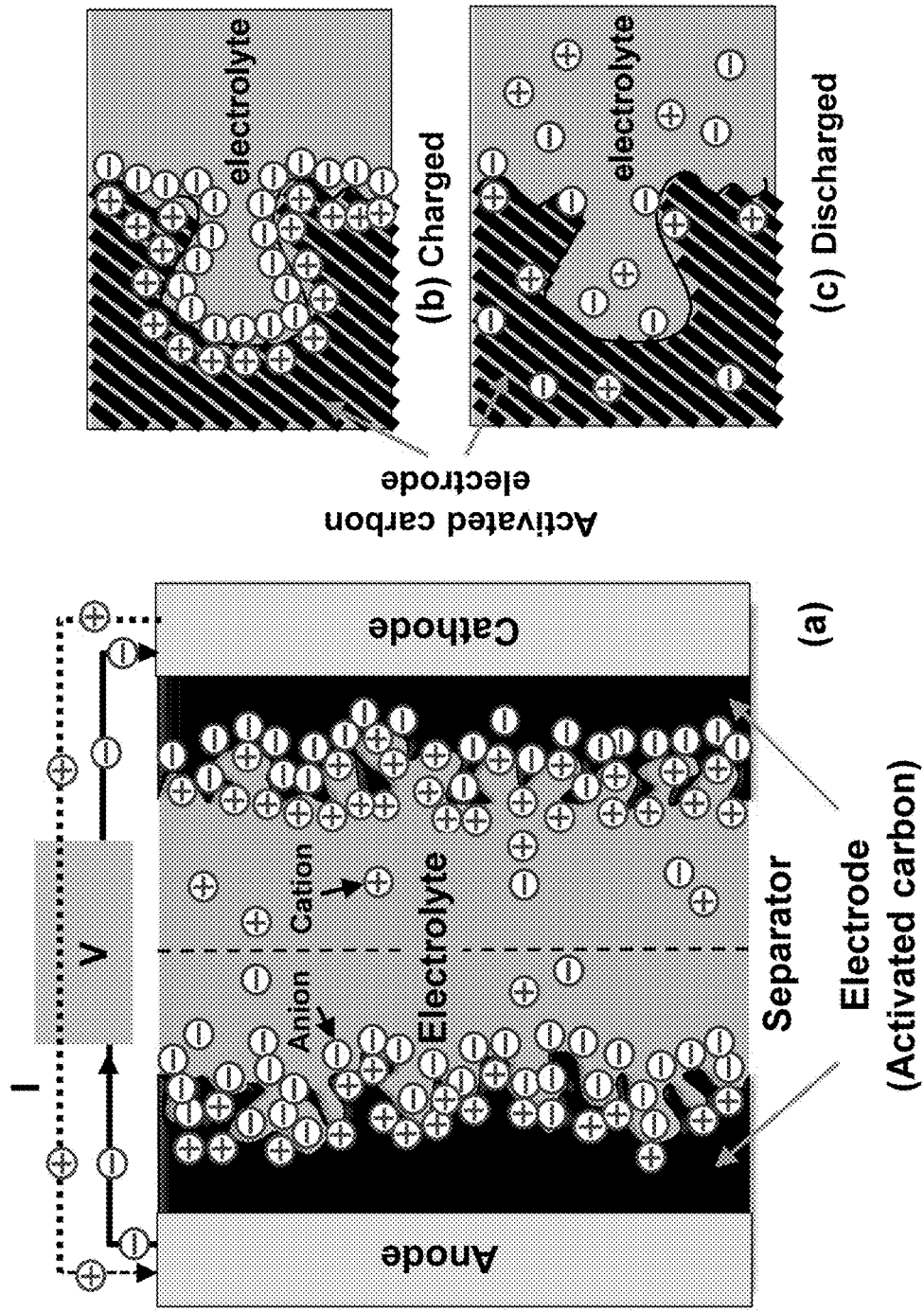
FIG. 10 schematically shows (a) a cross-sectional view of a supercapacitor, (b) and (c) partial views of the supercapacitor, according to one embodiment of the invention.

According to the invention, a supercapacitor has at least one of the anode and cathode including a thin film of LPAH. For example, FIG. 10 schematically shows (a) a cross-sectional view, (b) and (c) partial views of such a supercapacitor, according to one embodiment of the invention. In the exemplary embodiment, each of the anode and cathode of a supercapacitor has an activated carbon electrode formed of a thin film of LPAH. The supercapacitor, among other things, For such a supercapacitor, it overcomes the setbacks of pseudo capacitors using transition metal oxide, among other things, including high costs and toxicity.

Further, the supercapacitor has, among other things, the following characteristics:

Long, stable life cycle (greater than about 105);
  Lack of functional groups to undergo an irreversible redox process along the material surface;
  High specific surface area (about 1000-2000 $m^2g^{-1}$);
  Thermodynamic stability beyond the potential window for operation;
  A means to control the pore size and distribution of the material;
  Surface wet-ability; and
  Mechanical resilience.

Briefly, the invention, among other things, recites a unique and novel approach to fabricate a nanostructured carbon electrode usable for electrochemical devices, including solar cells, batteries, capacitors, fuel cells and other related systems. The approach includes how a homogeneous, mono-dispersed nanostructured carbon thin film is fabricated as part of an all-carbon electrode. By using a hydrogen (or hydrogen containing) gas electrical arc, large quantities of large-effective-surface-area polyaromatic hydrocarbon (LPAH) are produced. This material is dispersed in a block copolymer suspension to form a homogenous thin film which becomes part of a carbon electrode. The thin film in this case would include numerous nano sheets of LPAH with many available atomic bonds around their perimeters for chemical reactions. In addition, with the high density of nanopores and channels, it also provides high efficient charge (ions, electrons) transport through the layer.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

LISTING OF REFERENCES

[1]. Kalowekamo, J.; Baker, E., Estimating the manufacturing cost of purely organic solar cells. *Solar Energy* 2009, 83 (8), 1224-1231.

[2]. Grätzel, M., Photovoltaic and photoelectrochemical conversion of solar energy. *Philosophical Transactions of the Royal Society A: Mathematical, Physical and Engineering Sciences* 2007, 365 (1853), 993-1005.

[3]. Lee, B.; Hwang, D.-K.; Guo, P.; Ho, S.-T.; Buchholtz, D. B.; Wang, C.-Y.; Chang, R. P. H., Materials, Interfaces, and Photon Confinement in Dye-Sensitized Solar Cells. *The Journal of Physical Chemistry B* 2010, 114 (45), 14582-14591.

[4]. Lee, B.; Buchholz, D. B.; Guo, P.; Hwang, D.-K.; Chang, R. P. H., Optimizing the Performance of a Plastic Dye-Sensitized Solar Cell. *The Journal of Physical Chemistry C* 2011, 115 (19), 9787-9796.

[5]. Kroon, J. M.; Bakker, N. J.; Smit, H. J. P.; Liska, P.; Thampi, K. R.; Wang, P.; Zakeeruddin, S. M.; Grätzel, M.; Hinsch, A.; Hore, S.; Würfel, U.; Sastrawan, R.; Durrant, J. R.; Palomares, E.; Pettersson, H.; Gruszecki, T.; Walter, J.; Skupien, K.; Tulloch, G. E., Nanocrystalline dye-sensitized solar cells having maximum performance. *Progress in Photovoltaics: Research and Applications* 2007, 15 (1), 1-18.

[6]. Ito, S.; Nazeeruddin, M. K.; Liska, P.; Comte, P.; Charvet, R.; Pechy, P.; Jirousek, M.; Kay, A.; Zakeeruddin, S. M.; Grätzel, M., Photovoltaic characterization of dye-sensitized solar cells: effect of device masking on conversion efficiency. *Progress in Photovoltaics: Research and Applications* 2006, 14 (7), 589-601.

[7]. Wang, P.; Zakeeruddin, S. M.; Moser, J. E.; Nazeeruddin, M. K.; Sekiguchi, T.; Gratzel, M., A stable quasi-solid-state dye-sensitized solar cell with an amphiphilic ruthenium sensitizer and polymer gel electrolyte. *Nat Mater* 2003, 2 (6), 402-407.

[8]. O'Regan, B.; Schwartz, D. T.; Zakeeruddin, S. M.; Grätzel, M., Electrodeposited Nanocomposite n-p Heterojunctions for Solid-State Dye-Sensitized Photovoltaics. *Advanced Materials* 2000, 12 (17), 1263-1267.

[9]. Meng, Q. B.; Takahashi, K.; Zhang, X. T.; Sutanto, I.; Rao, T. N.; Sato, O.; Fujishima, A.; Watanabe, H.; Nakamori, T.; Uragami, M., Fabrication of an Efficient Solid-State Dye-Sensitized Solar Cell. *Langmuir* 2003, 19 (9), 3572-3574.

[10]. Wang, Q.; Zhu, K.; Neale, N. R.; Frank, A. J., Constructing Ordered Sensitized Heterojunctions: Bottom-Up Electrochemical Synthesis of p-Type Semiconductors in Oriented n-TiO2 Nanotube Arrays. *Nano Letters* 2009, 9 (2), 806-813.

[11]. Schmidt-Mende, L.; Bach, U.; Humphry-Baker, R.; Horiuchi, T.; Miura, H.; Ito, S.; Uchida, S.; Grätzel, M., Organic Dye for Highly Efficient Solid-State Dye-Sensitized Solar Cells. *Advanced Materials* 2005, 17 (7), 813-815.

[12]. Papageorgiou, N.; Maier, W. F.; Gratzel, M., An Iodine/Triiodide Reduction Electrocatalyst for Aqueous and Organic Media. *Journal of The Electrochemical Society* 1997, 144 (3), 876-884.

[13]. Papageorgiou, N., Counter-electrode function in nanocrystalline photoelectrochemical cell configurations. *Coordination Chemistry Reviews* 2004, 248 (13-14), 1421-1446.

[14]. Acharya, K. P.; Khatri, H.; Marsillac, S.; Ullrich, B.; Anzenbacher, P.; Zamkov, M., Pulsed laser deposition of graphite counter electrodes for dye-sensitized solar cells. *Applied Physics Letters* 2010, 97 (20), 201108-3.

[15]. Veerappan, G.; Boj an, K.; Rhee, S.-W., Sub-micrometer-sized Graphite As a Conducting and Catalytic Counter Electrode for Dye-sensitized Solar Cells. *ACS Applied Materials & Interfaces* 2011, 3 (3), 857-862.

[16]. Murakami, T. N.; Ito, S.; Wang, Q.; Nazeeruddin, M. K.; Bessho, T.; Cesar, I.; Liska, P.; Humphry-Baker, R.; Comte, P.; Pechy, P.; Gratzel, M., Highly Efficient Dye-Sensitized Solar Cells Based on Carbon Black Counter Electrodes. *Journal of The Electrochemical Society* 2006, 153 (12), A2255-A2261.

[17]. Imoto, K.; Takahashi, K.; Yamaguchi, T.; Komura, T.; Nakamura, J.-i.; Murata, K., High-performance carbon counter electrode for dye-sensitized solar cells. *Solar Energy Materials and Solar Cells* 2003, 79 (4), 459-469.

[18]. Huang, Z.; Liu, X.; Li, K.; Li, D.; Luo, Y.; Li, H.; Song, W.; Chen, L.; Meng, Q., Application of carbon materials as counter electrodes of dye-sensitized solar cells. *Electrochemistry Communications* 2007, 9 (4), 596-598.

[19]. Trancik, J. E.; Barton, S. C.; Hone, J., Transparent and Catalytic Carbon Nanotube Films. *Nano Letters* 2008, 8 (4), 982-987.

[20]. Roy-Mayhew, J. D.; Bozym, D. J.; Punckt, C.; Aksay, I. A., Functionalized Graphene as a Catalytic Counter Electrode in Dye-Sensitized Solar Cells. *ACS Nano* 2010, 4 (10), 6203-6211.

[21]. Murakami, T. N.; Grätzel, M., Counter electrodes for DSC: Application of functional materials as catalysts. *Inorganica Chimica Acta* 2008, 361 (3), 572-580.

[22]. Brownson, D. A. C.; Munro, L. J.; Kampouris, D. K.; Banks, C. E., Electrochemistry of graphene: not such a beneficial electrode material? *RSC Advances* 2011, 1 (6), 978-988.

[23]. Wang, X. K.; Lin, X. W., Carbon nanotubes synthesized in a hydrogen arc discharge. *Applied Physics Letters* 1995, 66 (18), 2430.

[24]. Roquerol, F. R. J. S., K., Adsorption by Powders and Solids: Principles, Methodology, and Applications. In *Academic Press*, San Diego, Calif., 1999.

[25]. Brunauer, S.; Emmett, P. H.; Teller, E., Adsorption of Gases in Multimolecular Layers. *Journal of the American Chemical Society* 1938, 60 (2), 309-319.

[26]. Hauch, A.; Georg, A., Diffusion in the electrolyte and charge-transfer reaction at the platinum electrode in dye-sensitized solar cells. *Electrochimica Acta* 2001, 46 (22), 3457-3466.

[27]. Duro, R.; Souto, C.; Gómez-Amoza, J. L.; Martinez-Pacheco, R.; Concheiro, A., Interfacial Adsorption of

[27]. Polymers and Surfactants: Implications for the Properties of Disperse Systems of Pharmaceutical Interest. *Drug Development and Industrial Pharmacy* 1999, 25 (7), 817-829.

[28]. Moore, V. C.; Strano, M. S.; Haroz, E. H.; Hauge, R. H.; Smalley, R. E.; Schmidt, J.; Talmon, Y., Individually Suspended Single-Walled Carbon Nanotubes in Various Surfactants. *Nano Letters* 2003, 3 (10), 1379-1382.

[29]. Hurter, P. N.; Hatton, T. A., Solubilization of polycyclic aromatic hydrocarbons by poly(ethylene oxide-propylene oxide) block copolymer micelles: effects of polymer structure. *Langmuir* 1992, 8 (5), 1291-1299.

[30]. Nap, R.; Szleifer, I., Control of Carbon Nanotube-Surface Interactions: The Role of Grafted Polymers. *Langmuir* 2005, 21 (26), 12072-12075.

[31]. Lin, Y.; Alexandridis, P., Temperature-Dependent Adsorption of Pluronic F127 Block Copolymers onto Carbon Black Particles Dispersed in Aqueous Media. *The Journal of Physical Chemistry B* 2002, 106 (42), 10834-10844.

[32]. Shvartzman-Cohen, R.; Florent, M.; Goldfarb, D.; Szleifer, I.; Yerushalmi-Rozen, R., Aggregation and Self-Assembly of Amphiphilic Block Copolymers in Aqueous Dispersions of Carbon Nanotubes. *Langmuir* 2008, 24 (9), 4625-4632.

[33]. Dan, B.; Irvin, G. C.; Pasquali, M., Continuous and Scalable Fabrication of Transparent Conducting Carbon Nanotube Films. *ACS Nano* 2009, 3 (4), 835-843.

[34]. Haggenmueller, R.; Rahatekar, S. S.; Fagan, J. A.; Chun, J.; Becker, M. L.; Naik, R. R.; Krauss, T.; Carlson, L.; Kadla, J. F.; Trulove, P. C.; Fox, D. F.; DeLong, H. C.; Fang, Z.; Kelley, S. O.; Gilman, J. W., Comparison of the Quality of Aqueous Dispersions of Single Wall Carbon Nanotubes Using Surfactants and Biomolecules. *Langmuir* 2008, 24 (9), 5070-5078.

[35]. Soni, S. S.; Brotons, G.; Bellour, M.; Narayanan, T.; Gibaud, A., Quantitative SAXS Analysis of the P123/Water/Ethanol Ternary Phase Diagram. *The Journal of Physical Chemistry B* 2006, 110 (31), 15157-15165.

[36]. Li, J.; Lu, L.; Su, Y.; Lai, M. O., *Fractal-based description for the three-dimensional surface of materials*. AIP: 1999; Vol. 86, p 2526-2532.

[37]. Weiss, A.; Dingenouts, N.; Ballauff, M.; Senff, H.; Richtering, W., Comparison of the Effective Radius of Sterically Stabilized Latex Particles Determined by Small-Angle X-ray Scattering and by Zero Shear Viscosity. *Langmuir* 1998, 14 (18), 5083-5087.

[38]. Shar, J. A.; Obey, T. M.; Cosgrove, T., Adsorption studies of polyethers Part 1. Adsorption onto hydrophobic surfaces. *Colloids and Surfaces A: Physicochemical and Engineering Aspects* 1998, 136 (1-2), 21-33.

[39]. Shvartzman-Cohen, R.; Nativ-Roth, E.; Baskaran, E.; Levi-Kalisman, Y.; Szleifer, I.; Yerushalmi-Rozen, R., Selective Dispersion of Single-Walled Carbon Nanotubes in the Presence of Polymers: the Role of Molecular and Colloidal Length Scales. *Journal of the American Chemical Society* 2004, 126 (45), 14850-14857.

[40]. Rouquerol, J.; Avnir, D.; Fairbridge, C. W.; Everett, D. H.; Haynes, J. H.; Pernicone, N.; Ramsay, J. D. F.; Sing, K. S. W.; Unger, K. K., RECOMMENDATIONS FOR THE CHARACTERIZATION OF POROUS SOLIDS. *Pure Appl. Chem.* 1994, 66 (8), 1739-1758.

[41]. Sakane, H.; Mitsui, T.; Tanida, H.; Watanabe, I., XAFS analysis of triiodide ion in solutions. *Journal of Synchrotron Radiation* 2001, 8 (2), 674-676.

[42]. Liberatore, M.; Decker, F.; Burtone, L.; Zardetto, V.; Brown, T.; Reale, A.; Di Carlo, A., Using EIS for diagnosis of dye-sensitized solar cells performance. *Journal of Applied Electrochemistry* 2009, 39 (11), 2291-2295.

[43]. Yuan, X.-Z.; Song, C.; Wang, H.; Zhang, J., Electrical Fundamentals Electrochemical Impedance Spectroscopy in PEM Fuel Cells. Springer London: 2010; pp 39-93.

[44]. Bisquert, J.; Garcia-Belmonte, G.; Fabregat-Santiago, F.; Bueno, P. R., Theoretical models for ac impedance of finite diffusion layers exhibiting low frequency dispersion. *Journal of Electroanalytical Chemistry* 1999, 475 (2), 152-163.

[45]. Kavan, L.; Yum, J. H.; Grätzel, M., Optically Transparent Cathode for Dye-Sensitized Solar Cells Based on Graphene Nanoplatelets. *ACS Nano* 2010, 5 (1), 165-172.

[46]. Wang, Q.; Moser, J.-E.; Gratzel, M., Electrochemical Impedance Spectroscopic Analysis of Dye-Sensitized Solar Cells. *The Journal of Physical Chemistry B* 2005, 109 (31), 14945-14953.

[47]. Li, G.-r.; Wang, F.; Jiang, Q.-w.; Gao, X.-p.; Shen, P.-w., Carbon Nanotubes with Titanium Nitride as a Low-Cost Counter-Electrode Material for Dye-Sensitized Solar Cells. *Angewandte Chemie International Edition* 2010, 49 (21), 3653-3656.

[48]. Zhu, G.; Pan, L.; Lu, T.; Xu, T.; Sun, Z., Electrophoretic deposition of reduced graphene-carbon nanotubes composite films as counter electrodes of dye-sensitized solar cells. *Journal of Materials Chemistry* 2011, 21 (38), 14869-14875.

[49]. Hasin, P.; Alpuche-Aviles, M. A.; Wu, Y., Electrocatalytic Activity of Graphene Multilayers toward I-/I3-: Effect of Preparation Conditions and Polyelectrolyte Modification. *The Journal of Physical Chemistry C* 2010, 114 (37), 15857-15861.

[50]. Fang, X.; Ma, T.; Guan, G.; Akiyama, M.; Kida, T.; Abe, E., Effect of the thickness of the Pt film coated on a counter electrode on the performance of a dye-sensitized solar cell. *Journal of Electroanalytical Chemistry* 2004, 570 (2), 257-263.

[51]. Adachi, M.; Sakamoto, M.; Jiu, J.; Ogata, Y.; Isoda, S., Determination of Parameters of Electron Transport in Dye-Sensitized Solar Cells Using Electrochemical Impedance Spectroscopy. *The Journal of Physical Chemistry B* 2006, 110 (28), 13872-13880.

[52]. Kern, R.; Sastrawan, R.; Ferber, J.; Stangl, R.; Luther, J., Modeling and interpretation of electrical impedance spectra of dye solar cells operated under open-circuit conditions. *Electrochimica Acta* 2002, 47 (26), 4213-4225.

[53]. Bisquert, J., Theory of the Impedance of Electron Diffusion and Recombination in a Thin Layer. *J. Phys. Chem. B* 2002, 106 (2), 325-333.

[54]. Chen, J.; Li, K.; Luo, Y.; Guo, X.; Li, D.; Deng, M.; Huang, S.; Meng, Q., A flexible carbon counter electrode for dye-sensitized solar cells. *Carbon* 2009, 47 (11), 2704-2708.

[55]. Chung, I.; Lee, B.; He, J.; Chang, R. P. H.; Kanatzidis, M. G., All-solid-state dye-sensitized solar cells with high efficiency. *Nature,* 2012, 485, 486-490.

[56]. Becker, H. L.; Ferry, V., U.S. Pat. No. 2,800,616, Jul. 23, 1957.

[57]. Pandolfo, A. G.; Hollenkamp, A. F., Carbon Properties and Their Role in Supercapacitors, *J. Power Sources* 2006, 157, 11-27.

[58]. Stankovich, S.; Dikin, D. A.; Piner, R. D.; Kohlhaas, K. A.; Kleinhammes, A.; Jia, Y.; Wu, Y.; Nguyen, S. T.; Ruoff, R. S., Synthesis of graphene-based nanosheets via chemical reduction of exfoliated graphite oxide. *Carbon* 2007, 45 (7), 1558-1565.

[59]. Shchukarev, A. V.; Korolkov, D. V., XPS Study of group IA carbonates. *Central European Journal of Chemistry* 2004, 2 (2), 347-362.

[60]. Barr, T. L.; Seal, S., Nature of the use of adventitious carbon as a binding energy standard. *Journal of Vacuum Science & Technology A* 1995, 13 (3), 1239-1246.

[61]. Hantsche, H., High resolution XPS of organic polymers, the scienta ESCA300 database. By G. Beamson and D. Briggs, Wiley, Chichester, *Advanced Materials* 1993, 5 (10), 778-778.

What is claimed is:

1. A method for fabricating a nanostructured carbon electrode, comprising the steps of:
   (a) providing a polyaromatic hydrocarbon, PAH, soot material produced by a hydrogen containing gas electrical arc, wherein operation of the hydrogen containing gas electrical arc is devoid of oxygen, and the PAH soot material is devoid of oxygen atoms;
   (b) mixing the PAH soot material with a surfactant in a solution to form a suspension thereof;
   (c) depositing the suspension onto a substrate to form a layered structure; and
   (d) sintering the layered structure at a temperature for a period of time to form a nanostructured carbon electrode comprising a film of PAH, wherein the surfactant does not exist in the film of PAH, and the film of PAH is devoid of oxygen atoms.

2. The method of claim 1, wherein the mixing step is performed by stirring for a predetermined time.

3. The method of claim 1, wherein the surfactant comprises an amphiphilictriblock copolymer.

4. The method of claim 3, wherein the amphiphilictriblock copolymer comprises poly(ethylene oxide)-poly(propylene oxide)-poly(ethylene oxide).

5. The method of claim 1, wherein the substrate comprises a patterned graphite substrate.

6. The method of claim 1, wherein the temperature is in a range of about 300-500° C., and wherein the period of time is in a range of about 10-30 minutes.

7. The method of claim 1, wherein the PAH film comprises randomly oriented nano-sheets of hydrocarbon species homogenously and uniformly distributed throughout the PAH film.

8. The method of claim 1, wherein the PAH film comprises a plurality of nanopores and channels.

9. A polyaromatic hydrocarbon electrode fabricated according to the method of claim 1.

* * * * *